(12) United States Patent
Hong et al.

(10) Patent No.: US 10,148,060 B2
(45) Date of Patent: Dec. 4, 2018

(54) LIDAR SENSOR SYSTEM WITH SMALL FORM FACTOR

(71) Applicant: SZ DJI TECHNOLOGY CO., LTD., Shenzhen (CN)

(72) Inventors: Xiaoping Hong, Shenzhen (CN); Huai Huang, Shenzhen (CN); Jiebin Xie, Shenzhen (CN)

(73) Assignee: SZ DJI Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/729,551

(22) Filed: Oct. 10, 2017

(65) Prior Publication Data

US 2018/0284282 A1 Oct. 4, 2018

Related U.S. Application Data

(63) Continuation of application No. PCT/CN2017/078611, filed on Mar. 29, 2017.

(51) Int. Cl.
*H01S 3/10* (2006.01)
*H01S 5/00* (2006.01)
(Continued)

(52) U.S. Cl.
CPC .............. *H01S 5/0071* (2013.01); *H01S 3/11* (2013.01); *H01S 5/0078* (2013.01);
(Continued)

(58) Field of Classification Search
CPC .. H01S 5/0071; H01S 5/06216; H01S 5/0657; H01S 5/06835; H01S 5/4012; H01S 5/4075; H01S 5/0078; H01S 2301/08
See application file for complete search history.

(56) References Cited

U.S. PATENT DOCUMENTS

| | | | | | |
|---|---|---|---|---|---|
| 4,283,116 | A | * | 8/1981 | Weis | B01D 59/34 359/204.1 |
| 5,179,565 | A | * | 1/1993 | Tsuchiya | G01R 15/22 372/26 |

(Continued)

FOREIGN PATENT DOCUMENTS

| | | |
|---|---|---|
| CN | 103403577 A | 11/2013 |
| CN | 103969637 A | 8/2014 |

(Continued)

OTHER PUBLICATIONS

Aijazi, et al., "Segmentation Based Classification of 3D Urban Point Clouds: A Super-Voxel Based Approach with Evaluation," (2013), 27 pages.

(Continued)

*Primary Examiner* — Kinam Park
(74) *Attorney, Agent, or Firm* — Perkins Coie LLP

(57) ABSTRACT

A sensor system can comprise a light source generating a light pulse that is collimated, and a plurality of optical elements. Each of the plurality of optical elements is configured to rotate independently about an axis that is substantially common, and the plurality of optical elements operate to collectively direct the light pulse to one or more objects in an angle of view of the sensor system. Furthermore, the sensor system can comprise a detector configured to receive, via the plurality of optical elements, at least a portion of photon energy of the light pulse that is reflected back from the one or more objects in the angle of view of the sensor system, and convert the received photon energy into at least one electrical signal.

30 Claims, 26 Drawing Sheets

(51) Int. Cl.
*H01S 3/11* (2006.01)
*H01S 5/0683* (2006.01)
*H01S 5/062* (2006.01)
*H01S 5/065* (2006.01)
*H01S 5/40* (2006.01)

(52) U.S. Cl.
CPC ........ *H01S 5/0657* (2013.01); *H01S 5/06216* (2013.01); *H01S 5/06835* (2013.01); *H01S 5/4012* (2013.01); *H01S 5/4075* (2013.01); *H01S 2301/08* (2013.01)

(56) References Cited

U.S. PATENT DOCUMENTS

| | | | |
|---|---|---|---|
| 5,249,046 | A | 9/1993 | Ulich et al. |
| 6,101,455 | A | 8/2000 | Davis |
| 6,246,258 | B1 | 6/2001 | Lesea |
| 6,344,937 | B1 | 2/2002 | Sparrold et al. |
| 6,666,855 | B2 | 12/2003 | Somani et al. |
| 7,085,400 | B1 | 8/2006 | Holsing et al. |
| 7,236,299 | B1 | 6/2007 | Smith et al. |
| 7,336,407 | B1 | 2/2008 | Adams et al. |
| 7,564,571 | B2 | 7/2009 | Karabassi et al. |
| 7,843,448 | B2 | 11/2010 | Wheeler et al. |
| 7,899,598 | B2 | 3/2011 | Woon et al. |
| 8,224,097 | B2 | 7/2012 | Matei et al. |
| 8,396,293 | B1 | 3/2013 | Korah et al. |
| 8,488,877 | B1 | 7/2013 | Owechko et al. |
| 8,503,046 | B2 | 8/2013 | Mikkelsen et al. |
| 8,605,998 | B2 | 12/2013 | Samples et al. |
| 8,620,089 | B1 | 12/2013 | Korah et al. |
| 8,665,122 | B2 | 3/2014 | Klepsvik |
| 9,076,219 | B2 | 7/2015 | Cha et al. |
| 9,097,804 | B1 | 8/2015 | Silver et al. |
| 9,098,753 | B1 | 8/2015 | Zhu et al. |
| 9,128,190 | B1 | 9/2015 | Ulrich et al. |
| 9,369,697 | B2 | 6/2016 | Kumagai et al. |
| 9,383,753 | B1 | 7/2016 | Templeton et al. |
| 9,396,545 | B2 | 7/2016 | Fu et al. |
| 9,470,548 | B2 | 10/2016 | Ahn et al. |
| 9,644,857 | B1 | 5/2017 | Ashgriz et al. |
| 2005/0248749 | A1 | 11/2005 | Kiehn et al. |
| 2007/0214687 | A1 | 9/2007 | Woon et al. |
| 2009/0310867 | A1 | 12/2009 | Matei et al. |
| 2010/0271615 | A1 | 10/2010 | Sebastian et al. |
| 2011/0285981 | A1 | 11/2011 | Justice et al. |
| 2012/0121166 | A1 | 5/2012 | Ko et al. |
| 2012/0170024 | A1 | 7/2012 | Azzazy et al. |
| 2012/0170029 | A1 | 7/2012 | Azzazy et al. |
| 2012/0256916 | A1 | 10/2012 | Kitamura et al. |
| 2014/0049765 | A1 | 2/2014 | Zheleznyak et al. |
| 2014/0071121 | A1 | 3/2014 | Russ et al. |
| 2015/0185313 | A1* | 7/2015 | Zhu .......... G01S 17/08 356/5.01 |
| 2015/0206023 | A1 | 7/2015 | Kochi et al. |
| 2015/0219920 | A1 | 8/2015 | Ando et al. |
| 2016/0070981 | A1 | 3/2016 | Sasaki et al. |
| 2016/0154999 | A1 | 6/2016 | Fan et al. |
| 2016/0311528 | A1 | 10/2016 | Nemovi et al. |
| 2016/0327779 | A1* | 11/2016 | Hillman .......... G02B 21/367 |
| 2017/0046840 | A1 | 2/2017 | Chen et al. |
| 2017/0046845 | A1 | 2/2017 | Boyle et al. |
| 2017/0178352 | A1 | 6/2017 | Harmsen et al. |
| 2017/0227628 | A1 | 8/2017 | Zheleznyak et al. |

FOREIGN PATENT DOCUMENTS

| | | |
|---|---|---|
| CN | 104463872 A | 3/2015 |
| CN | 105759253 A | 7/2016 |
| CN | 106019296 A | 10/2016 |
| JP | 63194211 A | 8/1988 |
| KR | 101665938 B1 | 10/2016 |
| WO | 2015148824 A1 | 10/2015 |
| WO | 2016127357 A1 | 8/2016 |
| WO | 2016170333 A1 | 10/2016 |

OTHER PUBLICATIONS

Douillard, et al., "On the Segmentation of 3D LIDAR Point Clouds," (2011), 8 pages.

Hackel, et al., "Fast Semantic Segmentation of 3D Point Clouds with Strongly Varying Density," (2016), 8 pages.

Levinson, et al., "Automatic Online Calibration of Cameras and Lasers," (2013), 8 pages.

Liu, et al., "A 3.9 ps RMS Resolution Time-To-Digital Converter Using Dual-sampling Method on Kintex UltraScale FPGA," (2006), 2 pages.

Montemerlo, et al., "Junior: The Stanford Entry in the Urban Challenge," (2008), 31 pages.

Palka, et al., "A Novel Method Based Solely on FPGA Units Enabling Measurement of Time and Charge of Analog Signals in Positron Emission Tomography," (2014), 6 pages.

Raismian, "Google Cars Autonomous Driving," (2017), 1 pages.

Schwarze, "A New Look at Risley Prisms," (2006), 5 pages.

Tongtong, et al., "Gaussian-Process-Based Real-Time Ground Segmentation for Autonomous Land Vehicles," (2014), 25 pages.

Wu, et al., "Several Key Issues on Implementing Delay Line Based TDCs using FPGA," (2009), 6 pages.

International Searching Authority, International Search Report and the Written Opinion of the International Searching Authority, PCT Application PCT/CN2017/078611, dated Dec. 29, 2017, 12 pages.

* cited by examiner

1900

(a)

(b)

2000

2300

(a)

(b)

2400

(a)

(b)

LIDAR SENSOR SYSTEM WITH SMALL FORM FACTOR

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED APPLICATION

The present application is a continuation of International Patent Application No. PCT/CN17/078611, filed Mar. 29, 2017, which is incorporated herein by reference.

FIELD OF THE INVENTION

The disclosed embodiments relate generally to optical sensing, and more particularly, but not exclusively, to optical scanning and ranging.

BACKGROUND

Sensors are important for performing various types of operations, e.g. by movable or stationary objects. Especially, movable objects, such as robots, manned vehicles and unmanned vehicles, can take advantage of different sensors for navigating in a complex environment. For example, movable objects need to be aware of surrounding condition in order for performing path planning and obstacle detection and avoidance in an unknown environment. This is the general area that embodiments of the invention are intended to address.

SUMMARY

Described herein are systems and methods that provide a technical solution for performing optical detection and ranging. A sensor system can comprise a light source generating a light pulse that is collimated, and a plurality of optical elements. Each of the plurality of optical elements is configured to rotate independently about an axis that is substantially common, and the plurality of optical elements operate to collectively direct the light pulse to one or more objects in an angle of view of the sensor system. Furthermore, the sensor system can comprise a detector configured to receive, via the plurality of optical elements, at least a portion of photon energy of the light pulse that is reflected back from the one or more objects in the angle of view of the sensor system, and convert the received photon energy into at least one electrical signal.

DETAILED DESCRIPTION

The invention is illustrated, by way of example and not by way of limitation, in the figures of the accompanying drawings in which like references indicate similar elements. It should be noted that references to "an" or "one" or "some" embodiment(s) in this disclosure are not necessarily to the same embodiment, and such references mean at least one.

The description of the invention as following uses a light detection and ranging (LIDAR) sensor system as example for a sensor system. It will be apparent to those skilled in the art that other types of sensor systems can be used without limitation.

In accordance with various embodiments, a technical solution can be provided for performing optical detection and ranging. A sensor system can comprise a light source generating a light pulse that is collimated, and a plurality of optical elements. Each of the plurality of optical elements is configured to rotate independently about an axis that is substantially common, and the plurality of optical elements operate to collectively direct the light pulse to one or more objects in an angle of view of the sensor system. Furthermore, the sensor system can comprise a detector configured to receive, via the plurality of optical elements, at least a portion of photon energy of the light pulse that is reflected back from the one or more objects in the angle of view of the sensor system, and convert the received photon energy into at least one electrical signal.

In accordance with various embodiments, a technical solution can be provided for performing optical detection and ranging. A sensor system can comprise a light source that operates to generate a series of light pulses at different time points, and a plurality of optical elements, wherein each of the plurality of optical elements is configured to rotate independently about an axis that is substantially common. Furthermore, the sensor system can comprise a controller that operates to control respective rotation of each of the plurality of optical elements, in order to collectively direct the series of light pulses to different directions in an angle of view of the sensor system, and a detector configured to detect a plurality of target points in the angle of view, wherein each target point is detected based on receiving at least a portion of photon energy of a light pulse in the series of light pulses that is reflected back from one or more objects in the angle of view.

Figure 1:
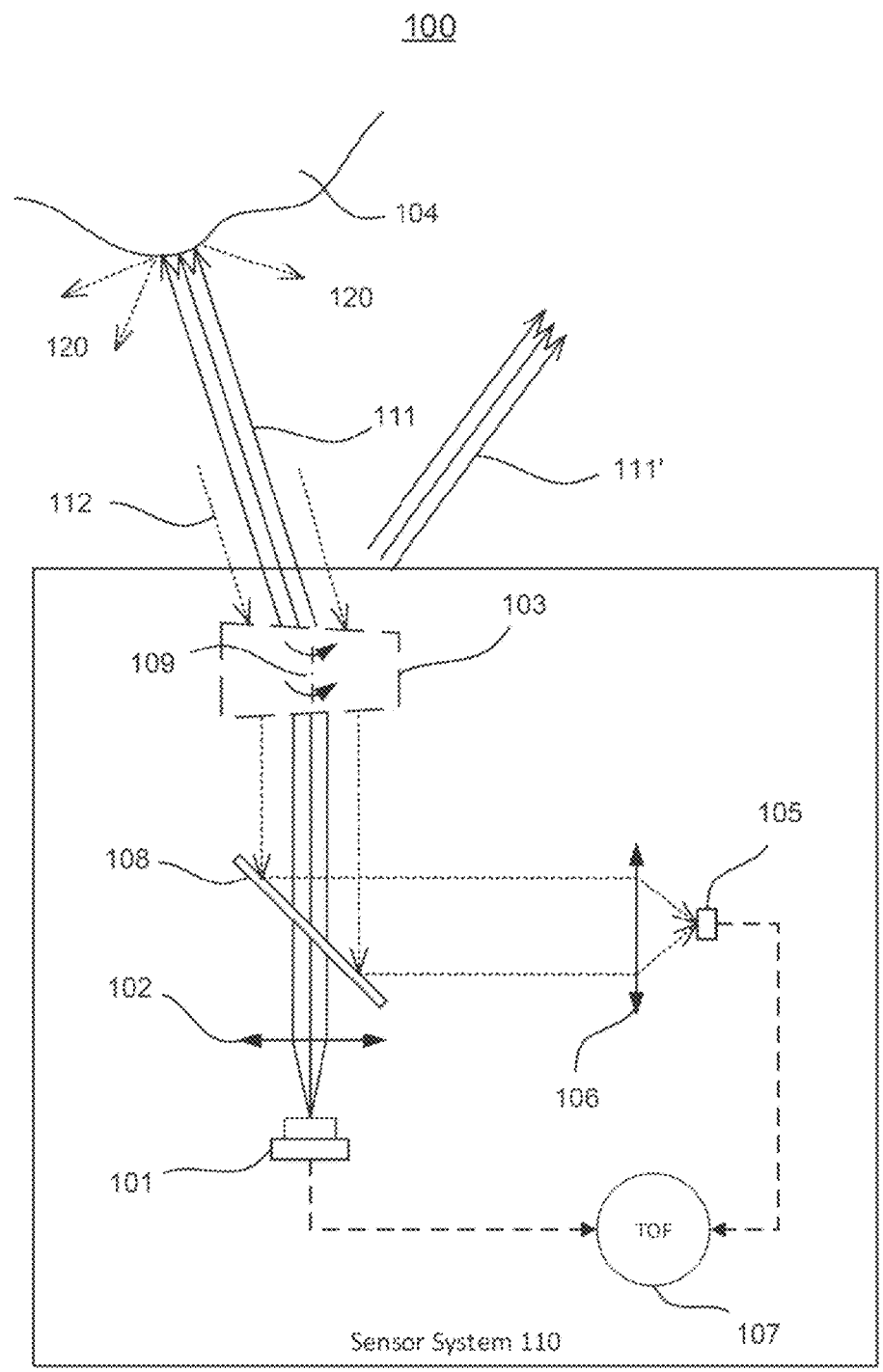
FIG. 1 shows a schematic diagram of an exemplary LIDAR sensing system, in accordance with various embodiments of the present invention.

FIG. 1 shows a schematic diagram 100 of an exemplary LIDAR sensing system, in accordance with various embodiments of the present invention. As shown in FIG. 1, a sensor system 110 can be used for detecting the distance between the sensor system 110 and an object 104 within an angle of view of the sensor system 100. For example, the sensor system 110 can be a LIDAR sensor system, which can detect the distance of the object 104 based on measuring the time for light to travel between the sensor system 110 and the object 104, i.e. the a time-of-flight (TOF).

In accordance with various embodiments, different schemes can be used for implementing the LIDAR sensor system. For example, the LIDAR sensor system can be based on a monostatic (i.e. co-axial or in-line) scheme, in which case the outgoing beam 111 and the return beam 112 may share at least a portion of the optical path. Alternatively, a LIDAR sensor system can be based on a different scheme such as a biostatic (i.e. bi-axial) scheme, in which case the outgoing beam 111 and the return beam 112 may be configured to travel along different optical paths.

As shown in FIG. 1, the sensor system 110 can include a light source 101, which can generate a laser beam. For example, the laser beam can be a single laser pulse or a series of laser pulses. Furthermore, the generated laser beam can be collimated. As known by skilled person in the art, collimated light refers to the light with parallel rays that may not spread substantially as the light propagates.

In accordance with various embodiments, a collimator can be used for collimating the light generated by a point source. For example, a lens 102 can be used for collimating the light generated by the light source 101. Alternatively, mirrors such as spherical mirrors and/or parabolic mirrors can be used for collimating the light generated by a point source. For example, instead of using the lens 102, a mirror (not shown) may be placed behind the light source 101 to reflect the light rays toward the emitting direction in a substantially parallel manner.

As shown in FIG. 1, the collimated light can be directed toward a beam steering/scanning device 103, which can induce deviation of the incident light. In accordance with various embodiments, the beam steering/scanning device 103 can steer the laser light to scan the environment surrounding the sensor system 110. For example, the beam steering device 103 can comprises various optical elements such as prisms, mirrors, gratings, optical phased array (e.g. liquid crystal controlled grating), or any combination thereof. Also, each of these different optical elements can rotate about an axis 109 that is substantially common (hereafter referred as a common axis without undue limitation), in order to steer the light toward different directions. I.e., the angle between rotation axes for different optical elements can be the same or slightly different. For example, the angle between rotation axes for different optical elements can be within a range of 0.01 degree, 0.1 degree, 1 degree, 2 degree, 5 degree or more.

Using the monostatic scheme as shown in FIG. 1, once the outgoing beam 111 hits an object 104, the back-reflected portion of the light returns in the exact opposite direction toward the LIDAR sensor system 110 and can be collected eventually by a receiving device of the detector 105. Thus, using the monostatic scheme, the LIDAR sensor system 100 has the advantage that the transmitting (or outgoing) field of view (FOV) (or angle of view) always aligns with the receiving FOV (or angle of view). Thus, the LIDAR sensor system 110 can have almost no blind area even at close distances from LIDAR the sensor system 110.

Figure 6:
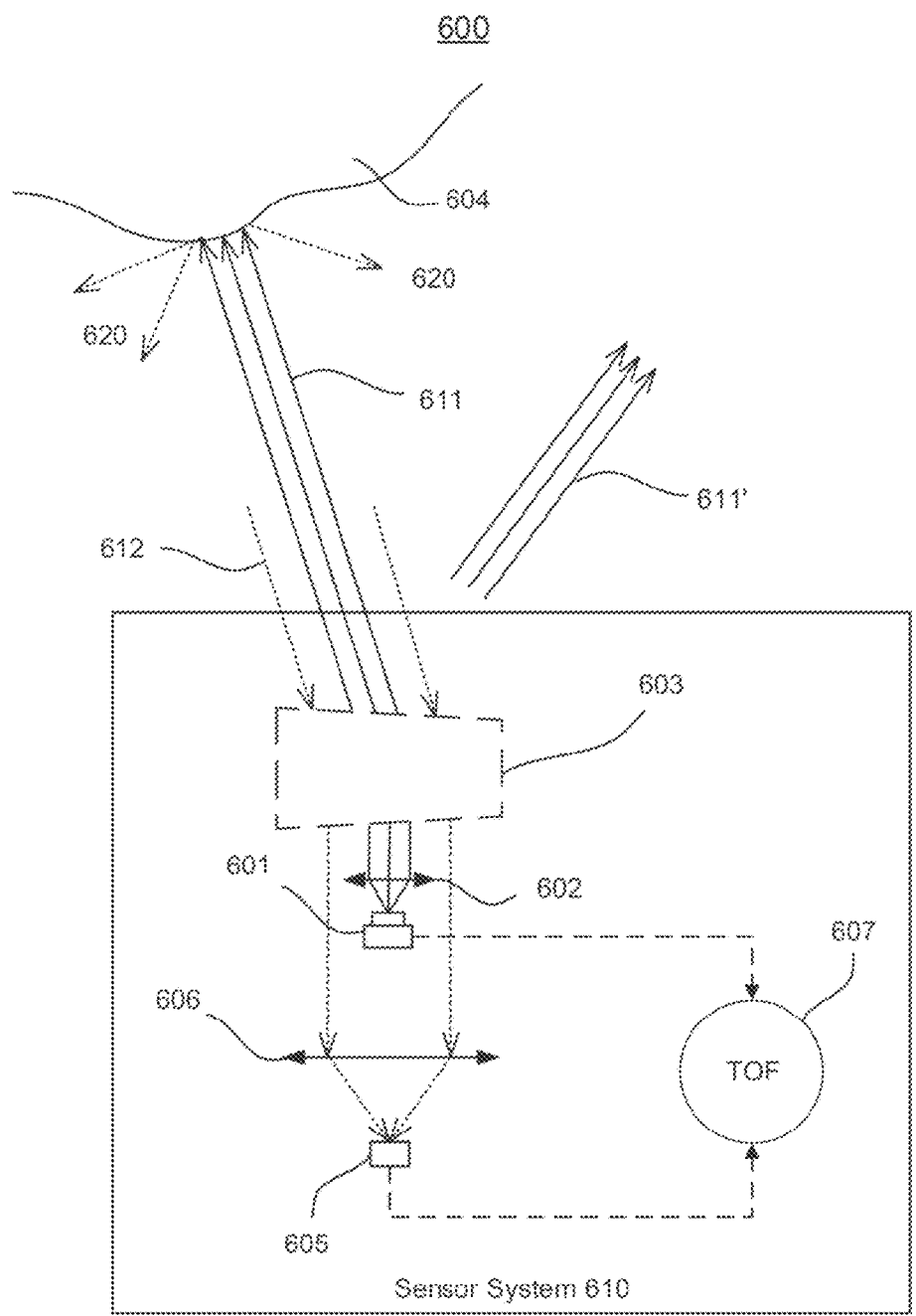
FIG. 6 shows an alternative exemplary LIDAR sensing scheme, in accordance with various embodiments of the present invention.

In accordance with various embodiments, different mechanisms may be used for implementing the monostatic system. For example, a beam splitter 108 can be arranged between the light source 101 (along with the lens 102) and the beam steering/scanning device 103. Alternatively, a LIDAR sensor system can be configured using a different co-aligned approach as shown in FIG. 6.

As shown in FIG. 1, the collimated light can pass through the beam splitter 108 and impinge on the beam steering/scanning device 103. Subsequently, the beam steering/scanning device 103 can be controlled to steer the light toward different directions, such as directions 111 and 111'. Furthermore, the beam splitter 108 can be configured to redirect return beam arriving at the beam splitter 108 toward the detector 105. For example, the beam splitter 108 can comprise a mirror with an opening. The opening of the beam splitter 108 may allow the collimated light from the light source 101 to pass through (toward the beam steering/scanning device 103), while the mirror portion of the beam splitter 108 can reflect the return beam 112 toward a receiving lens 106, which can collect and focus the returned beam on the detector 105.

In accordance with various embodiments of the present invention, the detector 105 can receive the returned light and convert the light into electrical signals. For example, the detector 105 can take advantage of a receiving device, such as an avalanche photodiode (APD), which is a highly sensitive semiconductor electronic device. The APD can convert light to electricity by exploiting the photocurrent effect.

In accordance with various embodiments of the present invention, a measuring circuitry, such as a time-of-flight (TOF) unit 107, can be used for measuring the TOF in order to detect the distance to the object 104. For example, the TOF unit 107 can compute the distance from TOF based on the formula t=2D/c, where D is the distance between the sensor system and the object, c is the speed of light, and t is the time that takes for light to take the round trip from the sensor system to the object and back to the sensor system. Thus, the sensor system 110 can measure the distance to the object 104 based on the time difference between the generating of the light pulse 111 by the light source 101 and the receiving of the return beam 112 by the detector 105.

In various embodiments, the light emission may be generated by the laser diode at the nanosecond (ns) level. For example, the light source 101 may generate a laser pulse with a duration close to 10 ns, and the detector 105 can detect the return signal for a similar duration. Furthermore, the reception process can determine the pulse receiving time, e.g. by detecting the rising edge of a measured electrical pulse. Here, the detection may take advantage of a multi-stage amplification process. Thus, the sensor system 110 can use the pulse receiving time information and the pulse emission information for calculating the time-of-flight information in order to determine the distance.

Figure 2:
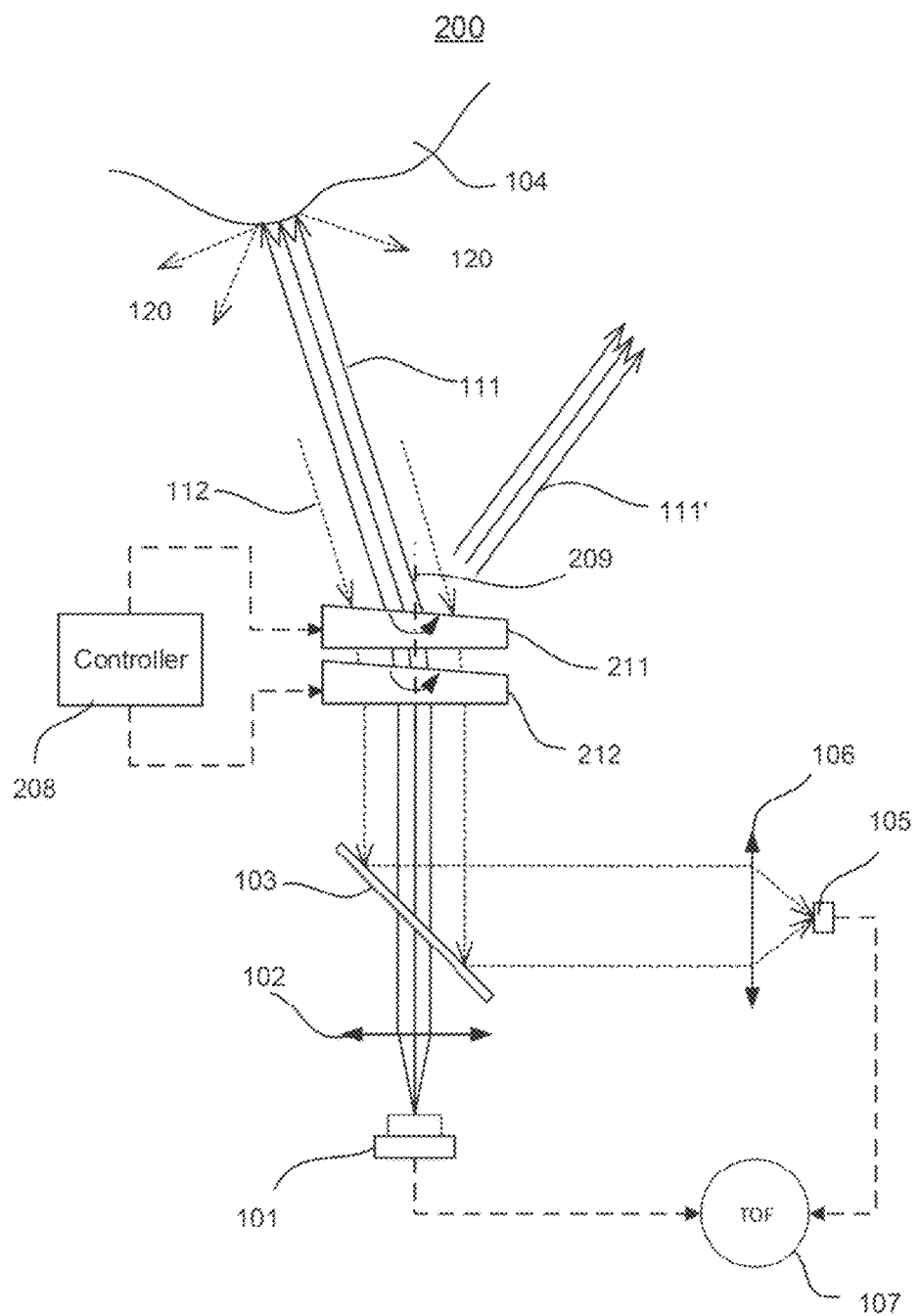
FIG. 2 shows a schematic diagram of an exemplary LIDAR sensor system using a Risley prism pair, in accordance with various embodiments of the present invention.

FIG. 2 shows a schematic diagram of an exemplary LIDAR sensor system using a Risley prism pair, in accordance with various embodiments of the present invention. As shown in FIG. 2, the LIDAR sensor system 200 can use a Risley prism pair, which may comprise two prisms 211-212, for light steering/scanning (i.e. functioning as the beam scanning/steering device 103 in the scheme as shown in FIG. 1). For example, the two prisms 211-212 may be placed next to each other in a parallel fashion. In various embodiments, the prisms 211-212 may have a round cross section and the central axes for the prisms 211-212 may coincide with each other or with small angle. In various embodiments, the motor (and/or other power/control units) can cause the prisms 211-212 to rotate about the common axis 209 (e.g. the central axis). I.e., the angle between rotation axes for different optical elements can be the same or slightly different. For example, the angle between rotation axes for different optical elements can be within a range of 0.01 degree, 0.1 degree, 1 degree, 2 degree, 5 degree or more.

In various embodiment, the rotation frequency, geometry and orientation of the two prisms may be different, so that the relative angle between the two prisms can change with time. Thus, when the laser beam passes through the prism pair 211-212, the direction of the outgoing beam may change accordingly.

Using the monostatic scheme, once the outgoing beam 111 hits an object 104, the back-reflected portion of the light returns in the opposite direction toward the LIDAR sensor system 110 and can be collected eventually by the receiving device of the detector 105. Due to time scale difference (i.e. the light speed is much faster than the rotation speed of the prism), the angle change caused by the rotation of the prism during the measuring time (or TOF) may be negligible. Also, using the monostatic scheme, the LIDAR sensor system 100 has the advantage that the transmitting FOV always aligns with the receiving FOV. Thus, the LIDAR sensor system 100 can have almost no blind area even at close distances.

In accordance with various embodiments of the present invention, the detector 105 can receive the returned light and convert the light into electrical signals. Also, a measuring circuitry, such as a time-of-flight (TOF) unit 107, can be used for measuring the TOF in order for detecting the distance to the object 104. Thus, the sensor system 110 can measure the distance to the object 104 based on the time difference between the generating of the light pulse 111 by the light source 101 and the receiving of the return beam 112 by the detector 105.

In accordance with various embodiments of the present invention, a controller 208 can be used for controlling the steering of the laser beam. For example, the controller 208 can control the respective rotation (e.g. angular position and/or speed) of each prism 211 or 212, independently, about a rotation axis 209. In some cases, each prism can be controlled by a separate controller. Additionally, the LIDAR sensor system 200 can obtain the angular position of each prism 211 or 212 in real-time, in order to calculate the exact direction of the outgoing beam. Such process can be repeated during the rotation of the prisms 211 and 212, and information about the angle of view of the LIDAR sensor system 200 can be obtained.

Figure 3:
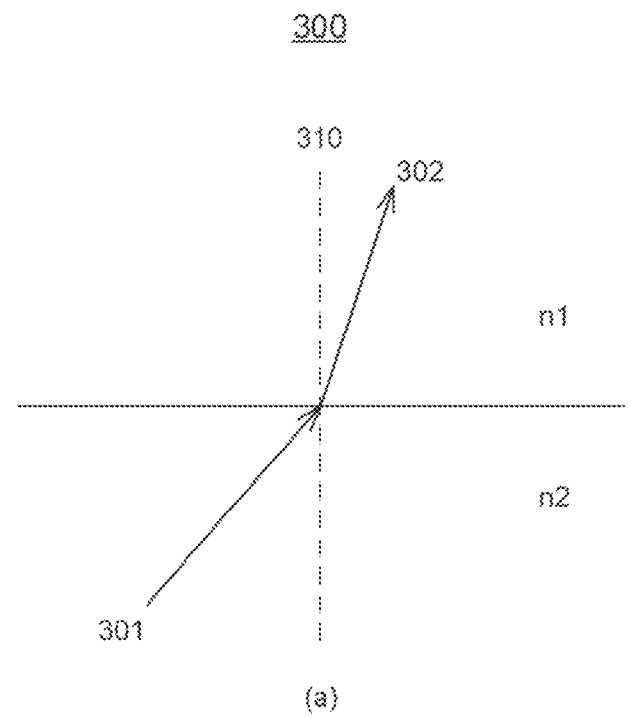
FIG. 3 shows an exemplary refraction model for using a Risley prism pair, in accordance with various embodiments of the present invention.
Figure 3:
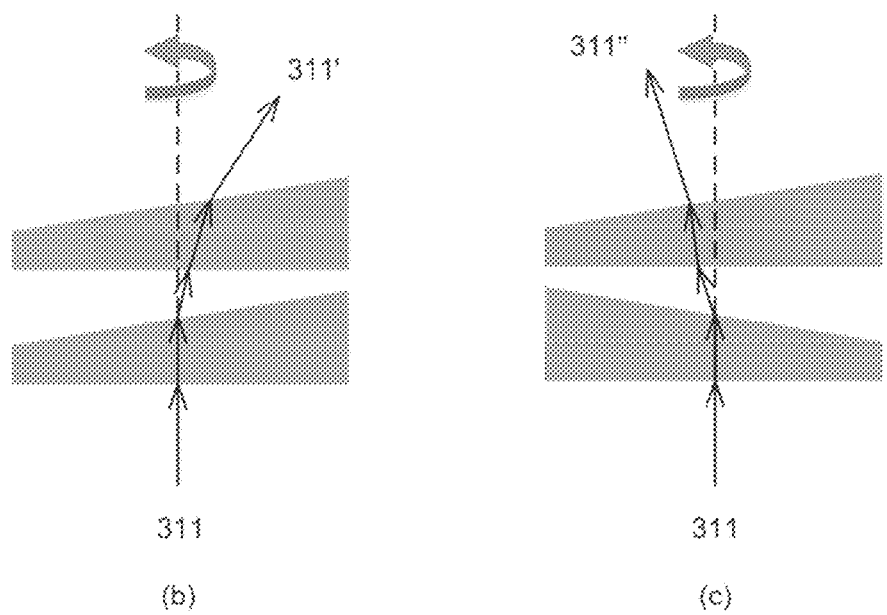

FIG. 3 shows an exemplary refraction model 300 for using a Risley prism pair, in accordance with various embodiments of the present invention.

As shown in FIG. 3(a), a light ray 301 (with a unit vector $\vec{l}$) may transmit through a first medium with a refraction index $n_2$ into a second medium a refraction index $n_1$. According to the Snell's law, the unit vector $\vec{v}$ that represents the light ray 302 after refraction can be represented as $$\vec{v} = r\vec{l} + (rc - \sqrt{1 - r^2(1-c^2)})\vec{n}$$

where, $r = n_1/n_2$, $c = -\vec{n} \cdot \vec{l}$, with $\vec{n}$ representing the unit vector for the normal direction 310 of the plane that separates the two mediums.

Thus, due to the difference in refraction index (i.e., the prisms can have a refractive index that is different from the air), refraction may occur at the various air-substrate interfaces as the beam pass through the prism.

In the example as shown in FIG. 3(b), the beam $\vec{l_1}$ 311 may be incident upon the first prism at the first surface from the air at a vertical angle. Since the beam $\vec{l_1}$ is perpendicular to the first surface, no refraction may occur (i.e. the beam $\vec{l_2}$ transmitting in the first prism is the same as the incident beam $\vec{l}_1$). (In other examples, refraction may occur at the first surface if the incident angle is not normal)

Furthermore, as the beam $\vec{l}_2$ exits from the first prism, refraction may occur at the second surface, since the beam $\vec{l}_1$ and surface normal direction $\vec{n}_2$ has a non-vertical angle. Assuming that the refractive index of the first prism is n, then the unit vector $\vec{v}_2$ for the refracted beam can be determined as in the following.

$$\vec{v}_2 = r \vec{l}_2 + (rc - \sqrt{1 - r^2(1-c^2)})\vec{n} = n \cdot \vec{l}_2 + (-n \cdot \vec{l}_2 \cdot \vec{n}_2 - \sqrt{1 - n_2(1 - (n \cdot \vec{l}_2 \cdot \vec{n}_2)^2)})\vec{n}_2$$

Furthermore, when the beam $\vec{v}_2$ incidents into the second prism, refraction occurs at the third surface (with a surface normal vector $\vec{n}_3$). The refracted beam $\vec{v}_3$ can be calculated based on the refraction law, assuming that the two prisms have the same refractive index n.

$$\vec{v}_3 = \frac{1}{n} \cdot \vec{v}_2 + \left( -\frac{\vec{v}_2 \cdot \vec{n}_3}{n} - \sqrt{1 - \frac{1^2}{n}\left(1 - \left(\frac{\vec{v}_2 \cdot \vec{n}_3}{n}\right)^2\right)} \right) \vec{n}_3$$

Then, as the beam $\vec{v}_3$ passing through the forth surface (with a surface normal vector $\vec{n}_4$), the outgoing beam can be calculated as in the following.

$$\vec{v}_4 = n \cdot \vec{v}_3 + (-n \cdot \vec{v}_3 \cdot \vec{n}_4 - \sqrt{1 - n^2(1 - (n \cdot \vec{v}_3 \cdot \vec{n}_4)^2)})\vec{n}_4$$

Thus, the final pointing direction of the refracted light 311' can have a deviation angle from the original incident direction 311. Here, the deviation angle θ between the outgoing beam $\vec{v}_4$ and the incident beam $\vec{l}_1$ can be calculated using the following formula.

$$\theta = \arccos\left( \frac{\vec{l}_1 \cdot \vec{v}_4}{|\vec{l}_1||\vec{v}_4|} \right)$$

As indicated in the above formula, the value of the angle θ can be determined based on the normal vectors $\vec{n}_1$, $\vec{n}_2$, $\vec{n}_3$ and $\vec{n}_4$ for the four prism surfaces. Further as shown in FIG. 3(c), as the prisms rotate, the outgoing angle 311" changes accordingly.

Referring back to FIG. 1, when the outgoing beam 111 hits the object 104, the reflected or scattered light may spread over a large angle 120 and only a fraction of the energy may be reflected back toward the sensor system 110. For example, the back-reflection can be described using the Lambertian scattering model (or other similar diffusive model), and the reflected energy (I) received by the detector 105 may be proportional to the square of the diameter (d) of the receiver and inversely proportional to the square of distance (D), i.e. I~(d/D)^2. Thus, the intensity for the received light for long distance ranging can be very small. Furthermore, in order to boost the received signal level for detecting far-away objects, a larger optical aperture is desirable, since the measurement signal is proportional to the square of the diameter, d, of the receiver. Thus, it is preferable that the system form factor can be minimized while maintaining a relatively large optical aperture size.

In accordance with various embodiments of the present invention, various mechanisms can be used to drive the rotation of the prisms. For example, hollow-core motors can be used for actuating the rotation of each prism. Thus, the sensor system can maximize the prism size for collecting the back-reflected light signal, and achieve high scanning speed due to the minimum load from these prisms. Alternatively, transmission through gear or belt can be used for actuating the rotation of each prism, which may achieve similar effects.

Figure 4:
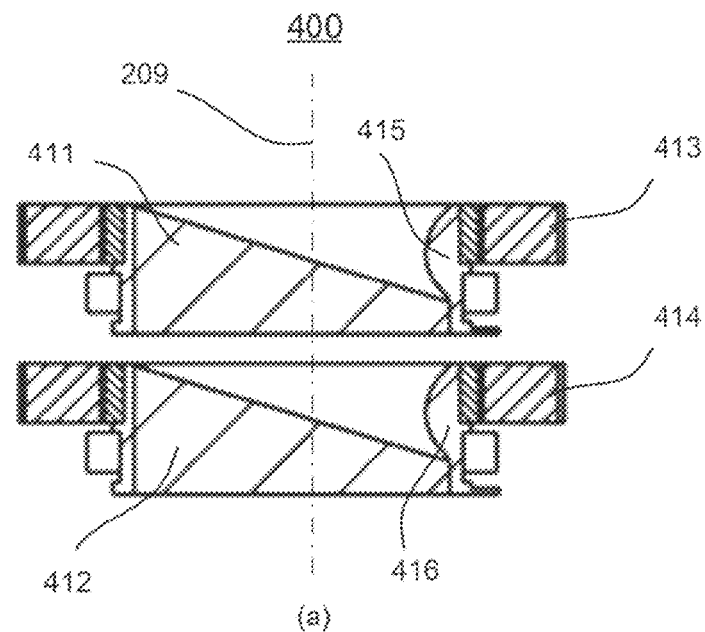
FIG. 4 shows an exemplary illustration of rotating prisms in a LIDAR sensor system, in accordance with various embodiments of the present invention.
Figure 4:
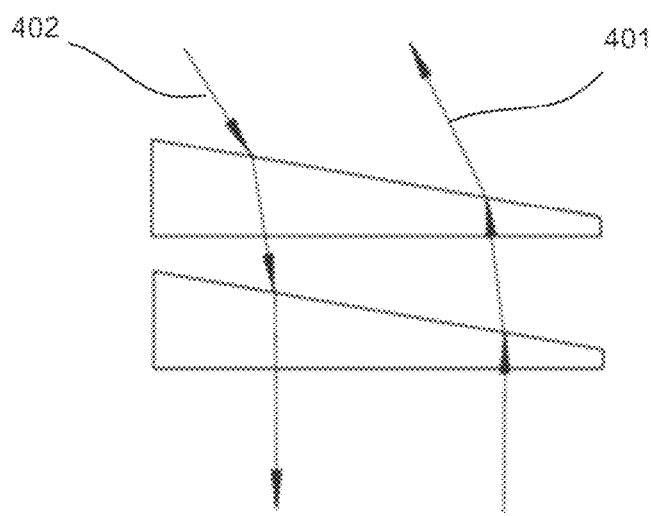

FIG. 4 shows an exemplary illustration of rotating prisms in a LIDAR sensor system 400, in accordance with various embodiments of the present invention. As shown in FIG. 4(a), a Risley prism pair can comprise multiple prisms 411 and 412, each of which is embedded in a hollow-core motor 413 or 414 respectively.

In accordance with various embodiments of the present invention, each of the hollow-core motors can be either an internal rotor motor or an external rotor motor. For example, both the hollow-core motors 413 and 414 can be internal rotor motors or external rotor motors. Alternatively, the hollow-core motors 413 and 414 may be in different types, i.e. one internal rotor motor and one external rotor motor.

In the example as shown in FIG. 4(a), both the hollow-core motors 413 and 414 can be internal rotor motors. Each of the hollow-core motor 413 or 414 can comprise a stator that is arranged outside a rotor via bearing support. For example, the prism 411 can be embedded in the hollow-core motor 413 and the prism 412 can be embedded in the hollow-core motor 414. Thus, the hollow-core motor 413 can actuate the prism 411 to rotate about a common axis 209 and the hollow-core motor 414 can actuate the prism 412 to rotate about the common axis 209, independently.

Additionally, due to the wedge (or angled) shape of the prisms 411 and 412, the rotating of each prism may be unstable since the mass distribution with respect to the rotation axis is imbalanced. As shown in FIG. 4, a small mass 415 and 416 may be added on (e.g. the outside clamp ring of) the prisms 411 and 412 respectively, in order to balance the mass distribution with respect to the rotation axis. Thus, the LIDAR sensor system can improve stability for the rotating prisms and also can reduce noise and increase the lifetime for the rotating prisms.

In accordance with various embodiments of the present invention, various mechanisms can be used for acquiring the precise angle (or angular position) of each prism. The angle (or angular position) of each prism can be defined in a rotational plane of each prism, which can be a plane perpendicular to the common rotational axis 209. For example, Hall sensors, optical encoders, and other similar sensors can be used by the LIDAR sensor system for precisely measuring the angle (or angular position) of each prism in order for achieving high pointing accuracy.

As shown in FIG. 4(b), the deviation angle for the outgoing beam 401 and also the return beam 402 can be effected by both the refractive index and the inclined angle of the prisms. Thus, assuming the refractive index of the material is the same, the larger this inclined angle is the larger the scanning angle (or FOV) can be.

On the other hand, materials with large refractive index can be used for making the prism in order to achieve a large angle of view for the LIDAR sensor system. For example, polycarbonate, a plastic material with a refractive index (n=1.567 @ 900 nm), can be used. Alternatively, glasses with higher refractive index (n~1.8) can be used. For example, using the example of a Risley prism pair with two identical rotating prisms, the FOV for such a LIDAR sensor system may be approximately ±20° (or ±30°), when each rotating prism has an inclined angle of 17 degree (or 23 degree). Additionally, other materials, such as liquid-filled prisms, which may have even higher refractive index, can be used. Alternatively, various diffracting or reflecting optical devices (such as transmission gratings, reflection gratings, and mirrors etc.) may be used to replace the prisms, as long as such device can divert the beam in a similar fashion.

Figure 5:
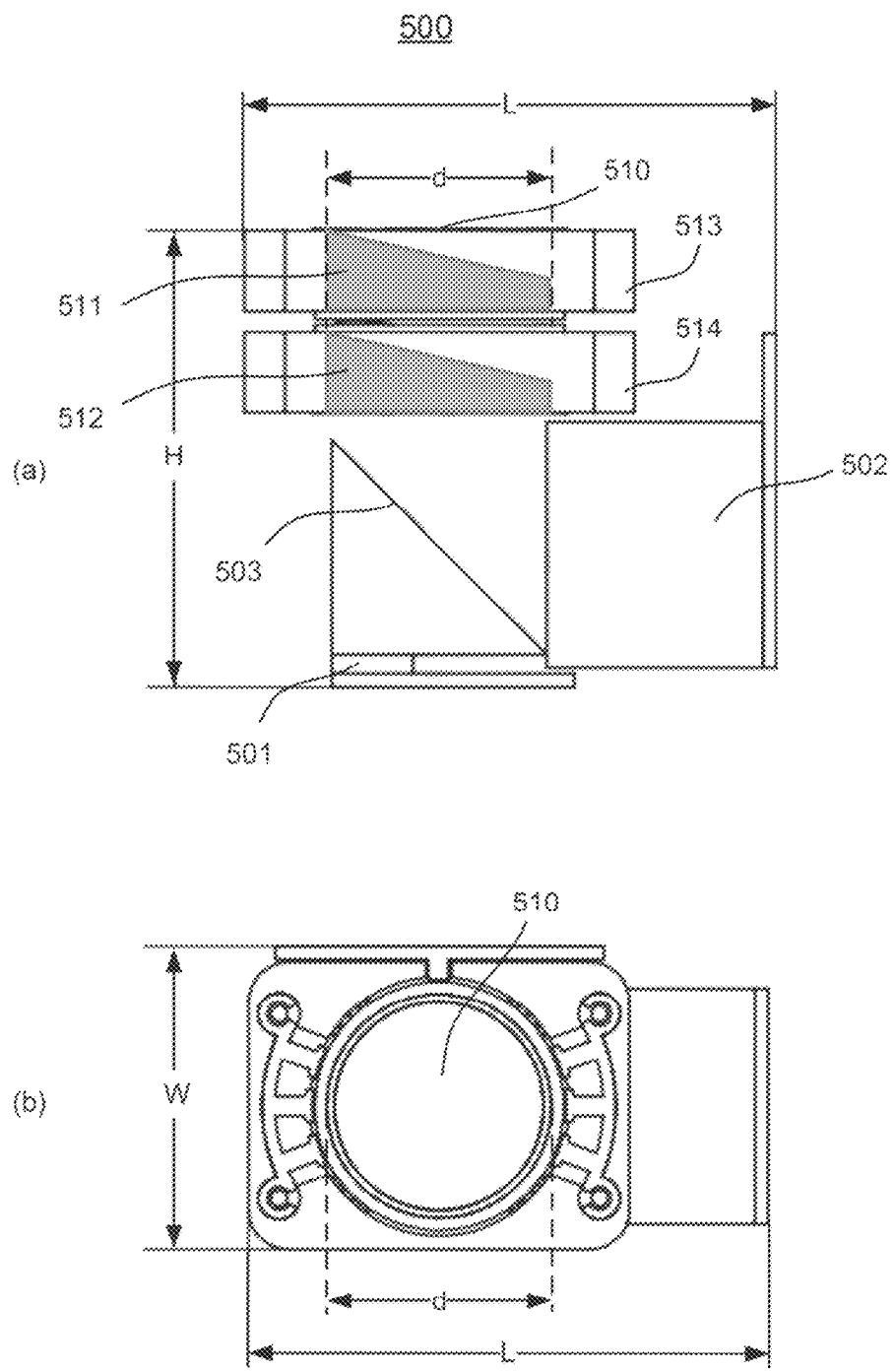
FIG. 5 shows the configuration of an exemplary LIDAR sensor system using a beam splitter, in accordance with various embodiments of the present invention.

FIG. 5 shows the configuration of an exemplary LIDAR sensor system using a beam splitter, in accordance with various embodiments of the present invention. As shown in FIG. 5, the LIDAR sensor system 500 can take advantage of a Risley prism pair, which includes a pair of prisms 511 and 512. Furthermore, each of the prisms 511 and 512 can be embedded in a hollow motor 513 and 514, respectively, and each prism can rotate independently about a common axis (not shown).

Using the monostatic scheme, the transmitting optics and receiving optics can be aligned along the same optical path. For example, a light source 501 can generate a laser beam that can be collimated. Additionally, a beam splitter 503 can be configured to allow the collimated light to pass through toward the pair of prisms 511 and 512 for light steering. Also, the beam splitter 503 can be configured to redirect the return beam toward a receiving unit 502, which may include a detector and one or more lens for collecting the returning light. Thus, the monostatic configuration can provide large optical aperture for a LIDAR sensor system with limited form factor (or size). Also, using the monostatic configuration, a LIDAR sensor system can collect sufficient light signal to ensure a good signal to noise ratio, which is important for small form factor LIDAR sensor systems.

In accordance with various embodiments of the present invention, the Risley prisms enjoy various advantages, such as compactness, relative insensitivity to vibration, high scanning speed and low moment of inertia. Also, each individual prism in the Risley prism pair can be configured with an independent rotational axis. As shown in FIG. 5, the LIDAR sensor system has a dimension (or form factor) of length (L), width (W), and height (H). Furthermore, the optical aperture area, which can be estimated as a circle with a diameter d, occupy a large portion of the cross section (L×W). Thus, the LIDAR sensor system can have a large form factor efficiency, which can be defined as a ratio of the optical aperture size over the LIDAR system form factor.

FIG. 6 shows an alternative exemplary LIDAR sensing scheme 600, in accordance with various embodiments of the present invention. As shown in FIG. 6, a sensor system 610 can be used for detecting the distance between the sensor system 610 and an object 604 within an angle of view of the sensor system 610. For example, the sensor system 610 can be a LIDAR sensor system, which can detect the distance between the sensor system 610 and the object 604 based on measuring the time for light to travel between the sensor system 610 and the object 604, i.e. time-of-flight (TOF).

In accordance with various embodiments, the LIDAR sensor system can be based on a monostatic scheme, in which case the outgoing beam 611 and the return beam 612 can share at least a portion of the optical path (i.e. in a co-axial or in-line system).

As shown in FIG. 6, the sensor system 610 can include a light source 601, which can generate a laser beam, such as a single laser pulse, or a series of laser pulses. Additionally, the generated laser beam can optionally be collimated (e.g. using a lens 602). The light source 601 (including the collimating lens 602) can be arranged between the detector 605 and the beam steering/scanning device 603.

As shown in FIG. 6, the collimated light can be directed toward the beam steering/scanning device 603. Subsequently, the beam steering/scanning device 603 can steer the light to different directions, e.g. the directions 611 and 611'.

In accordance with various embodiments, various types of optical elements can be used for steering the laser light for scanning the environment surrounding the sensor system. For example, the beam steering/scanning device 603 can comprises various optical elements such as prisms, mirrors, grating, optical phased array, or any combination thereof. Also, each of these different optical elements can rotate about an axis that is substantially common (hereafter referred as a common axis without undue limitation), in order to steer the light toward different directions. I.e., the angle between rotation axes for different optical elements can be the same or slightly different. For example, the angle between rotation axes for different optical elements can be within a range of 0.01 degree, 0.1 degree, 1 degree, 2 degree, 5 degree or more.

In one example, the beam steering/scanning device 603 can be a Risley prism pair, which comprise two prisms (each with a refractive index that is different from the air). The beam may be refracted at different air-substrate interface. As the pair of prisms rotating about a common axis (not shown), the angle of deviation between the final pointing direction 611 or 611' and the original incident direction may be changing. Such changing deviation can be used for scanning the environment surrounding the sensor system by rotating the prisms.

As shown in FIG. 6, using a monostatic scheme, once the outgoing beam 611 hits an object 604, the return beam, i.e. the back-reflected portion of the light, returns in opposite direction towards the sensor system 610 and can be collected by the detector 605. Additionally, a receiving lens 606 can be used for collecting the returned light and focusing the returned light to the detector 605. Since the detector 605 is arranged facing the beam steering/scanning device 603, from which direction the light returns, there is no need for additional optical devices such as a beam splitter as shown in FIG. 1.

In accordance with various embodiments, different configurations can be used for arranging the receiving lens 606, which can collect the returned beam and focus the returned beam toward the detector 605. For example, the receiving lens 606 can be arranged between the light source 601 and the detector 605 as shown in FIG. 6. Alternatively, the receiving lens 606 may be arranged alongside or in front of the lens 602.

Alternatively, instead of arranging the light source directly in the aperture, an emitting structure with a mirror can be positioned between the detector 605 and the beam steering/scanning device 603. Furthermore, the sensor system 610 can optimize the size of the light source or the emitting structure, in order to block less return beam.

In accordance with various embodiments of the present invention, the detector 605 can receive the returned light and convert the light into electrical signals. For example, the detector 605 can take advantage of a receiving device, such as an avalanche photodiode (APD). The APD is a highly sensitive semiconductor electronic device that can convert light into electrical signals by exploiting the photocurrent effect.

In accordance with various embodiments of the present invention, a measuring circuitry, such as a time-of-flight (TOF) unit 607, can be used for measuring the distance to the object 604. For example, the TOF unit 607 can compute the TOF based on the time for light to travel between the sensor system and the object. Thus, the sensor system can measure the distance of the object 604.

Figure 7:
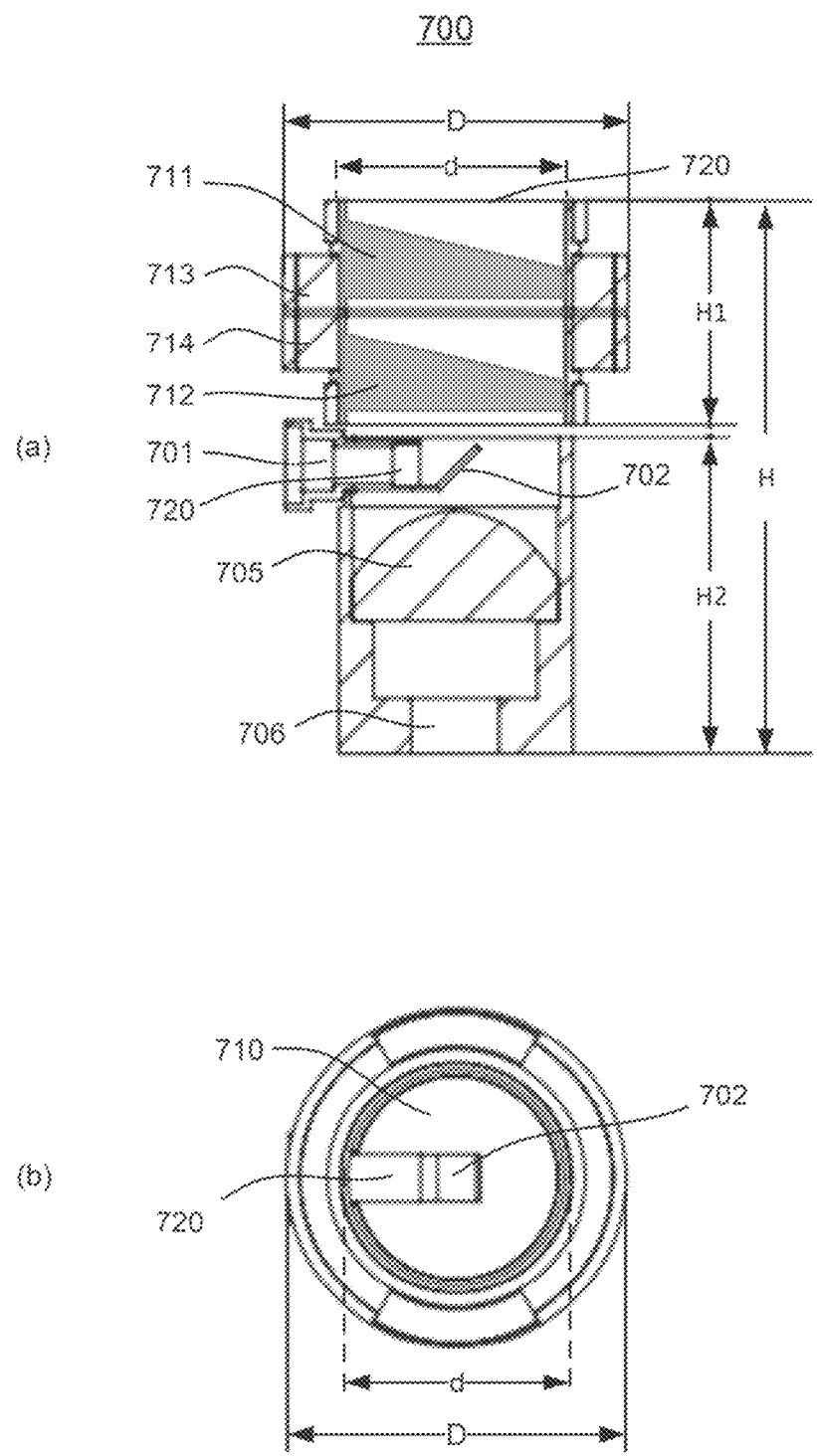
FIG. 7 shows an exemplary illustration of an alternative LIDAR sensor system, in accordance with various embodiments of the present invention.

FIG. 7 shows an exemplary illustration of an alternative LIDAR sensor system, in accordance with various embodiments of the present invention. As shown in FIG. 7(a), the LIDAR sensor system 700 can take advantage of a pair of prisms 711 and 712 (e.g. a Risley prism pair), each of which can be embedded in a hollow motor 713 or 714 respectively. Furthermore, each prism 711 or 712 can rotate independently about a common axis (not shown).

In accordance with various embodiments of the present invention, the Risley prisms enjoy various advantages, such as compactness, relative insensitivity to vibration, and low moment of inertia. Also, each individual prism in the Risley prism pair can be configured with an independent rotational axis.

Using the monostatic scheme, the transmitting optics and receiving optics can be aligned along the same optical path. For example, an emission structure 720 can be arranged between the receiving lens 705 and the prism 712. The emitting structure 720 can include a mirror, which can be mounted or integrated on one end (e.g. the distal end) of the emitting structure 720. Furthermore, the sensor system 710 can optimize the size of the emitting structure, in order to block less return beam.

As shown in FIG. 7(a), a light source 701, which is arranged by a side of the LIDAR sensor system (e.g. on another end, such as the proximal end, of the emitting structure 720), can generate a laser beam, which is collimated. The mirror 702 can reflect the collimated light toward the prisms 711 and 712, which in turn steer the light toward the outgoing direction. Then, the receiving lens 705 can collect the return beam and direct it toward a detector 706.

In the example as shown in FIG. 7, the LIDAR sensor system has a dimension (or form factor) of D and H, and the optical aperture area can be estimated as a circle with a diameter d. The optical aperture occupies a large portion of the system cross section. Thus, the LIDAR sensor system can have a large form factor efficiency, which can be represented as the optical aperture size/LIDAR system form factor.

As shown in FIG. 7, the LIDAR sensor system can use almost the entire prism area for collecting the back-reflected light signal. Since the prism area constitutes a large portion of the system form factor, the LIDAR sensor system's form factor can be minimized while maintaining a large optical aperture. The LIDAR sensor system 700 can boost the signal level for detecting far-away objects by taking advantage of a large optical aperture. Thus, a light weight, small form factor LIDAR sensor system can be achieved. Using such a monostatic configuration, the LIDAR sensor system with a small form factor can achieve large usable optical aperture and can collect sufficient light signal to ensure a good signal to noise ratio, which is important for detecting objects in the surrounding environment.

Figure 8:
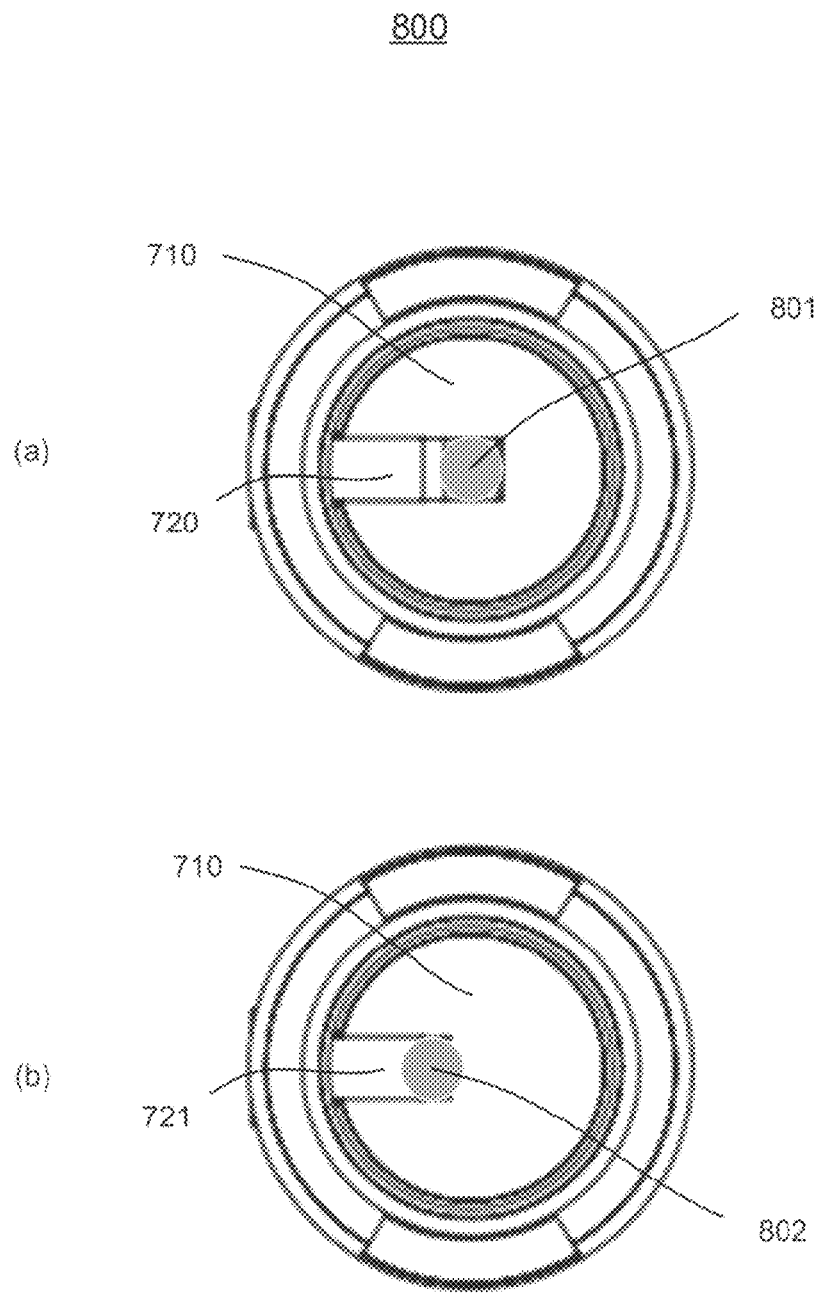
FIG. 8 shows an exemplary illustration of a LIDAR sensor system with different light emitting configurations, in accordance with various embodiments of the present invention.

FIG. 8 shows an exemplary illustration of a LIDAR sensor system with different light emitting configurations, in accordance with various embodiments of the present invention. As shown in FIG. 8(a), a mirror 801, which is either mounted on or integrated as part of the emitting structure 720, can reflect the light generated by the light source toward the emitting direction. Since the emitting structure 720 is positioned within the aperture, the emitting structure 720 may block a portion of the aperture area, which could otherwise be used for receiving the return beam.

As shown in FIG. 8(a), the mirror 801 can be positioned at the center of the aperture. Correspondingly, the emitting structure 720 may be extended to the center of the aperture, which may block a substantial area in the optical aperture. On the other hand, as shown in FIG. 8(b), the mirror 802 can be positioned off-centered to the extent that the reflected light does not hit anything in the outgoing direction. Thus, less aperture area may be blocked by the emitting structure 721.

Figure 9:
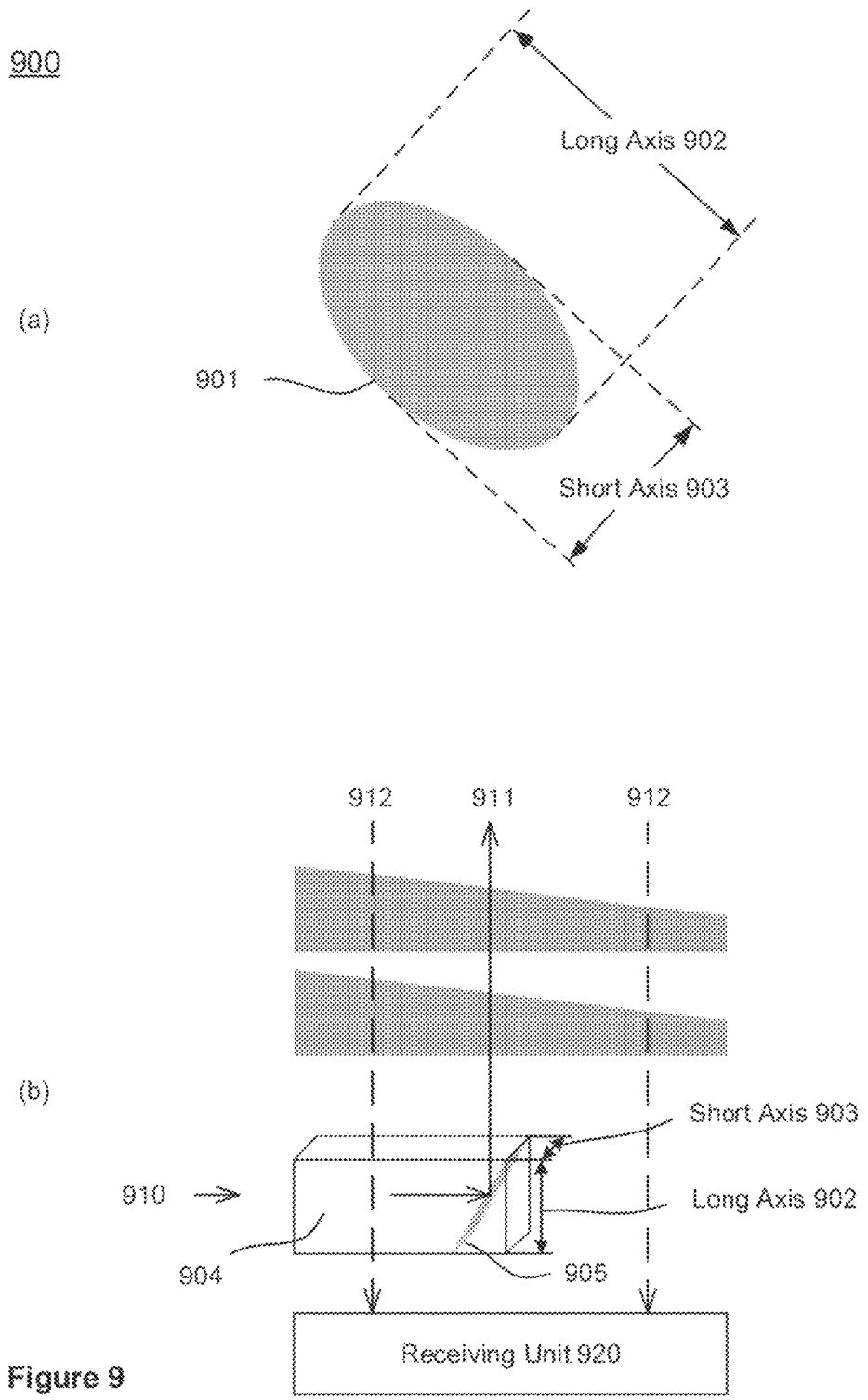
FIG. 9 shows an exemplary illustration of optimizing a light emitting structure in a LIDAR sensor system, in accordance with various embodiments of the present invention.

FIG. 9 shows an exemplary illustration of optimizing a light emitting structure in a LIDAR sensor system, in accordance with various embodiments of the present invention. As shown in FIG. 9(a), due to the internal structure of the laser diode, the laser beam profile 901 may have a rectangular or elliptical shape (i.e. with a long axis 902 and a short axis 903).

In accordance with various embodiments of the present invention, the emitting structure 904 can be configured in a geometry that can take advantage of the laser beam profile 901 in order to block less light for the receiving system.

As shown in FIG. 9(b), the emitting structure 904 can be configured in a rectangular block shape. The rectangular shaped surface of the emitting structure 904 facing toward the return beam 912 can be configured to have a width that matches the short axis 903 of the laser beam profile 901. Also, the emitting structure 904 can be configured to have a dimension that matches the long axis 902 of the laser beam profile 901. Thus, the mirror 905 on the emitting structure 904 can reflect the full profile of the laser beam toward the emitting direction 911.

As shown in FIG. 9(b), a light source (not shown) can generate a laser beam 910 with the beam profile 901 that is collimated. The collimated light 910 can propagate through the emitting structure 904 before being reflected toward the emitting direction (i.e. the outgoing beam 911) by a mirror 905. Subsequently, the return beam 912 can share at least a portion of the optical path with the outgoing beam 911 and eventually be collected by the receiving unit 920 (which may include a lens and a detector). Since cross section of the emitting structure closely matches the outgoing laser beam profile, the emitting structure maximizes outgoing beam while minimizing unnecessary blockage of the return beam.

In accordance with various embodiments of the present invention, using the monostatic scheme, the LIDAR sensor system can have the advantage that it is easier to align the light source and the receiver without a blind area. Also, the monostatic system can minimize the overall system form factor while optimizing the optical aperture for excellent signal to noise ratio. The monostatic system can have a large field-of-view (FOV), can achieve high scanning speed and good resolution for a single pair of laser emitter and detector. Thus, the monostatic system can have good performance while enjoying low cost and small size. Additionally, the monostatic system allows for dynamically adjustable pointing capability and supports different scanning patterns.

In accordance with various embodiments of the present invention, different approaches can be used separately or collectively for preventing optical contamination (such as undesired back-reflection) caused by various types of stray light.

Figure 10:
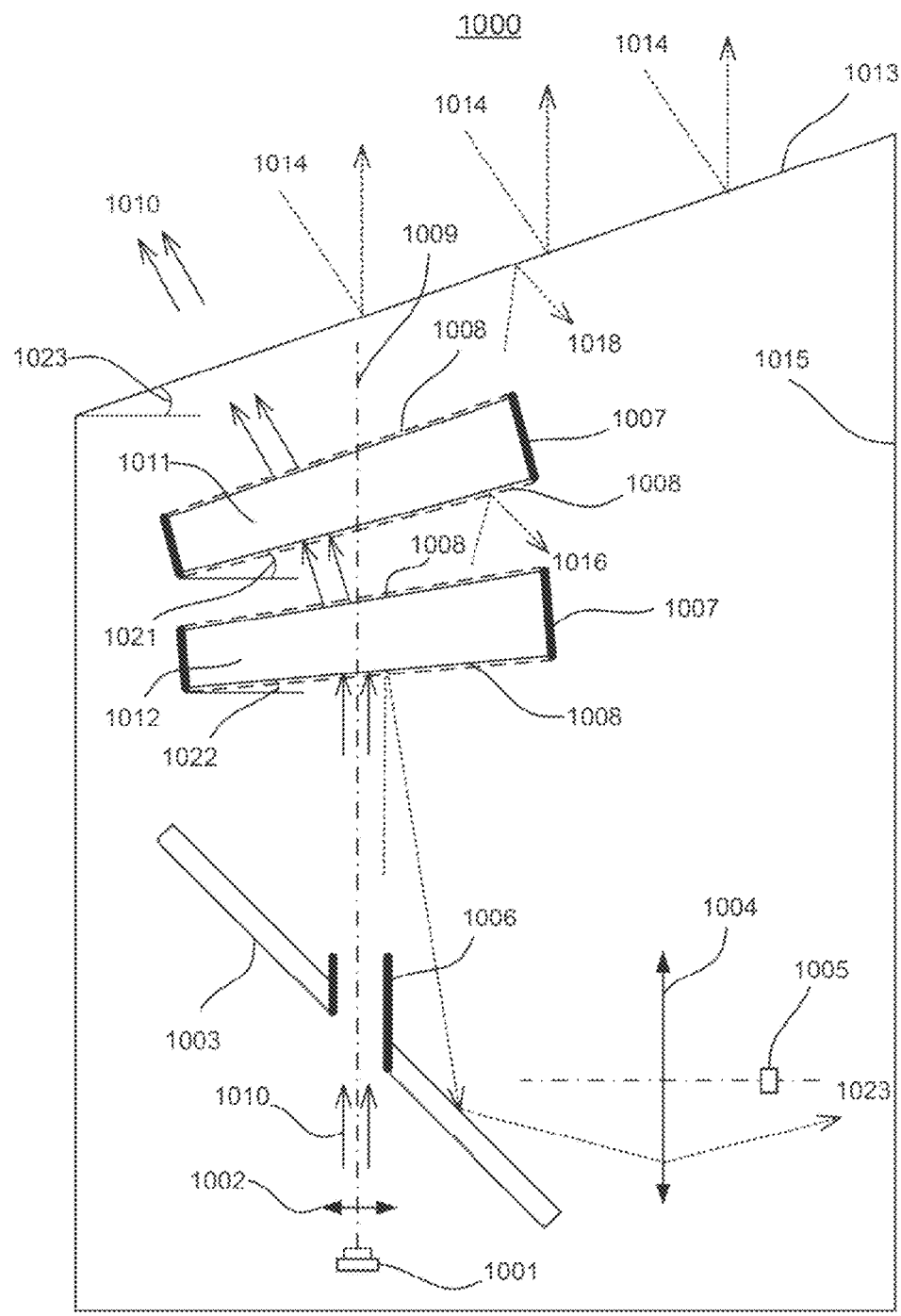
FIG. 10 shows a schematic diagram of preventing optical contamination in an exemplary LIDAR sensor system, in accordance with various embodiments of the present invention.

FIG. 10 shows a schematic diagram of preventing optical contamination in an exemplary LIDAR sensor system, in accordance with various embodiments of the present invention. As shown in FIG. 10, the LIDAR sensor system 1000 can reject various types of stray light.

The optical contamination may be caused by various types of stray light, such as the reflected light and/or scattered light. In the examples as shown in FIG. 5 and FIG. 7, the LIDAR transmission light may contaminate (or interfere) with the receiving of return beam by the detector. Such contamination (or interference) may cause trouble in recognizing the close distance echoes (i.e. the T=0 problem). Also, due to the scattering and reflecting of the emitted light signal on the propagation path (such as the glass cover, optical element, and sidewalls along the optical path), a portion of the transmitted laser light may be collected by the detector 1005.

The light intensity for the optical contamination (or interference) can be considerably high, which may lead to the circuit system saturation (e.g. in the high magnification scenarios). The optical contamination (or interference) may result in an amplifier failure for a period of time (e.g. ~100 ns for the range of 15 m). As a result, a LIDAR sensor system may not be able to detect objects in the surrounding environment in close proximity. Additionally, the optical contamination (or interference) may cause difficulty in recognizing the rising edge of the electrical signal for received light, which can be troublesome in determining the light pulse receiving time (~10 ns). Additionally, the optical contamination may cause false signals at random time, which may prevent detection of the true optical signal and thus the TOF. Also, there may be electrical signal interference (since electromagnetic wave is prone to interfere due to the close proximity between the light source emitting opening and the detector).

In accordance with various embodiments of the present invention, various approaches can be used for rejecting scattered and reflected light in a LIDAR sensor system, in order to solve the T=0 problem.

For example, various optical elements in the LIDAR sensor system, through which the laser light is transmitted along the optical path, may be slightly tilted to avoid direct reflection. As shown in FIG. 10, the prism 1011 can be configured with an angle 1021, and the prism 1012 can be configured with an angle 1022. Thus, as the prisms 1007 and 1008 rotate, e.g. about a common axis 1009, a portion of the light pulses 1010 that is reflected back from the various reflective surfaces, e.g. the beam 1016, 1018 and 1023, can avoid hitting the detector 1005. In various embodiments, the different prisms 1011 and 1012 can be configured with the same tilt angle. Alternatively, the different prisms 1011 and 1012 may be configured with different tilt angles to achieve similar or better outcome.

Also, the enclosing window 1013 can be configure with an angle 1023, so that the direct reflection light 1018 can be direct to avoid the detector.

Furthermore, anti-reflection coatings can be applied to the surfaces of various optical elements in the LIDAR sensor system to reduce the direct reflection and scattered light. As shown in FIG. 10, various surfaces of the prisms 1011 and 1012 can be applied with coating 1008. Also, the coating 1008 may be applied on the two surfaces of the emission window 1013 of the enclosed housing 1015.

Figure 11:
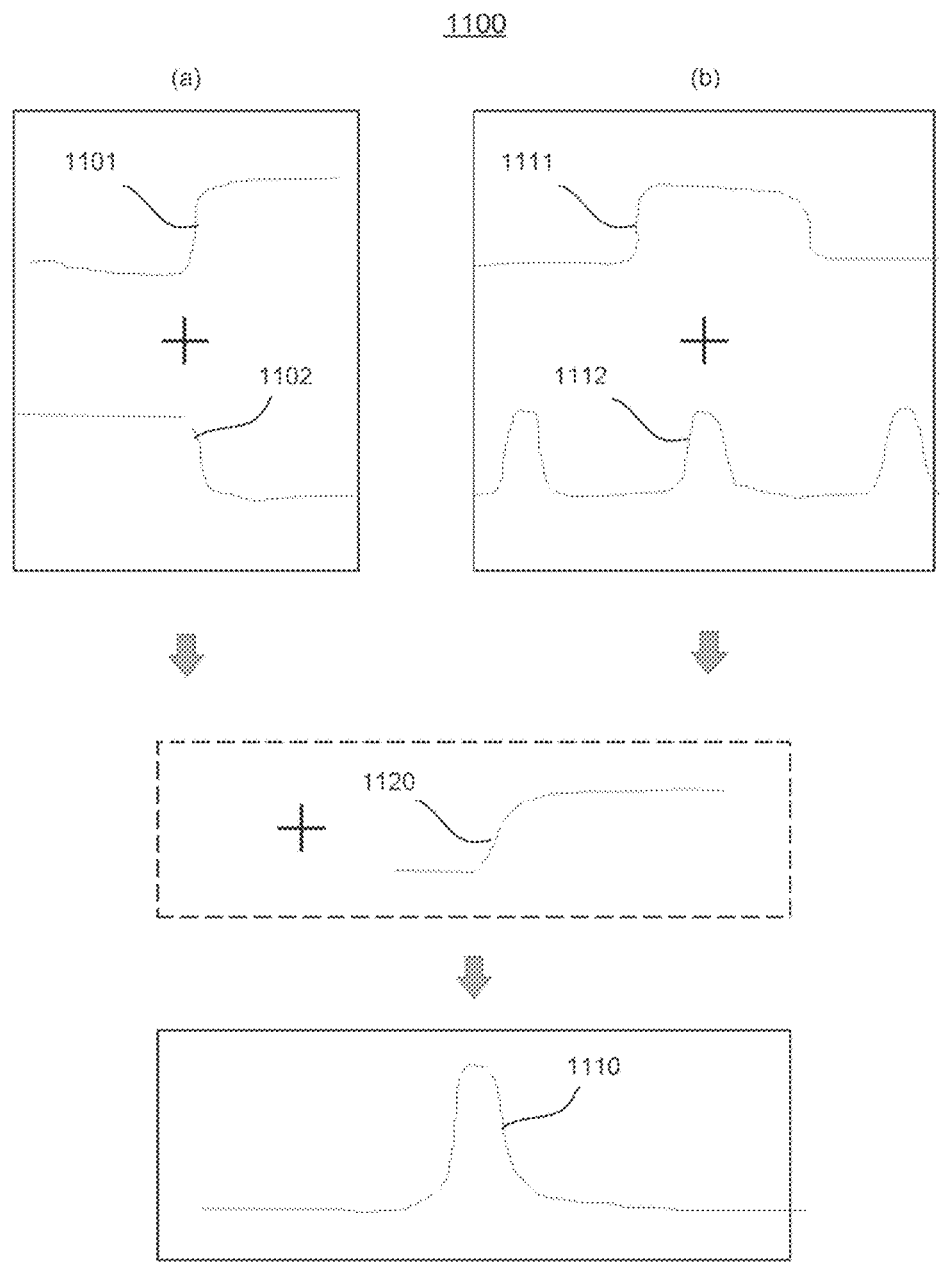
FIG. 11 shows a schematic diagrams of creating a bandpass filter with narrow passing band, in accordance with various embodiments of the present invention.

Additionally, in order to further reduce the contamination (or interference), a band-pass filter centered at the laser wavelength can be used to reject out-of-band lights. As shown in FIG. 11, multiple layers of coatings can be applied to create a band-pass filter 1100 with narrow passing band. In the example as shown in FIG. 11(a), a first layer of coating 1101 may only allow light with relative long wavelength to pass and a second layer of coating 1102 may only allow light with relative short wavelength to pass. Collectively, a band-pass filter with narrow passing band 1110 can be achieved. Alternatively, in the example as shown in FIG. 11(b), a first layer of coating 1111 may allow light with relative wide band of wavelength to pass and a second layer of coating 1112 may allow light in multiple narrow bands of wavelengths to pass. Collectively, a band-pass filter with narrow passing band 1110 can be achieved. Also an optional layer 1120 can be applied to further modify the narrow passing band 1110.

Furthermore, other optical devices, such as an etalon or Fabry Perot interferometer (FPI), can be applied on the surfaces of the prisms 1011 and 1012 (e.g. along with various types of coatings). For example, the FPI can be either a standalone FPI or a stationary FPI. The standalone FPI can be electrically controlled so that the peak wavelength can vary accordingly, which is beneficial for tracking the change of laser wavelength and continuously block all other interferences. On the other hand, the stationary FPI can take advantage of a thin film coated on a surface. The thin film can comprise two high reflective coatings separated by a spacer.

Referring back to FIG. 10, different approaches can be used for reducing the scattered light. For example, oxidation or dark paint 1007 can be applied on the inner surfaces of the supporting structures or sidewalls of the optical components to reduce the scattered stray light.

In accordance with various embodiments of the present invention, specific optical structures or devices can be used to further reject the stray light. As shown in FIG. 10, the LIDAR sensor system 1000 can use a baffle tube 1006, such as a blackened thin laser beam tube, to extend the laser exit opening on the beam splitter 1003 (e.g. the opening on a mirror). The baffle tube 1006 can extend the laser exit opening to significantly reduce the stray light, which may potentially interfere with the receiving of return beam at the detector 1005.

Thus, the LIDAR sensor system 1000 can separate the actual echoes from the scattered or back-reflected transmitting beam and solve the T=0 problem.

Additionally, other types of contaminations (or interferences), such as the sunlight, may be presented in the LIDAR sensor system 1000. The direct sunlight or scattered sunlight may go into the receiver of the detector 1005, and cause receiver saturation or trigger false signals. For example, the sun shining on the wall or other surfaces behind a target object, may be reflected toward the LIDAR sensor system. The reflected sunlight may be more intensive than the laser light that is reflected back from the object, which may cause measurement errors.

In accordance with various embodiments of the present invention, various approaches can be used separately or collectively for preventing the contamination (or interference) by the sunlight. For example, optical isolation (e.g. a housing 1015 that encloses the various optical components and the detector 1005) can be used for reducing the contamination (or interference) caused by the sunlight. Additionally, the LIDAR sensor system can use an optical filter, which allows only the light with a specific wavelength range (e.g. laser wavelength +/−10 nm) to pass through (e.g. as shown in FIG. 11). Thus, the optical filter allows the return beam to pass through while reducing the effect of sunlight.

Another approach is to increase the laser power. Also, the LIDAR sensor system can use a very small instantaneous field of view (IFOV) or use pulsed light output, which can increase instantaneous power such that the intensity of the return beam can be comparable to or stronger than that of the sunlight.

In accordance with various embodiments of the present invention, the receiving device for the detector 1005 can be configured with a profile that matches the laser beam profile (i.e. the emitting and receiving IFOV) for rejecting the stray light. For example, the profile for the detector 1005 can be determined based on the laser beam profile (and corresponding optical configuration), e.g. using a formula, I/f1=L/f2, where I indicates the dimension of the receiving device, L indicates the profile of the laser beam, f1 is the focal length of the lens 1004 and f2 is the focal length of the lens 1002. Thus, light signals other than the return beam can be rejected.

In accordance with various embodiments of the present invention, various types of optical devices, such as a spatial filtering device and/or a field stop aperture device, can be arranged along the optical path of the return beam to reject various stray lights. For example, the spatial filtering and the field stop aperture can be used to reject scattered sunlight. Also, the LIDAR sensor system can employ a circuit that can dynamic adjust APD gain with sunlight detection.

Figure 12:
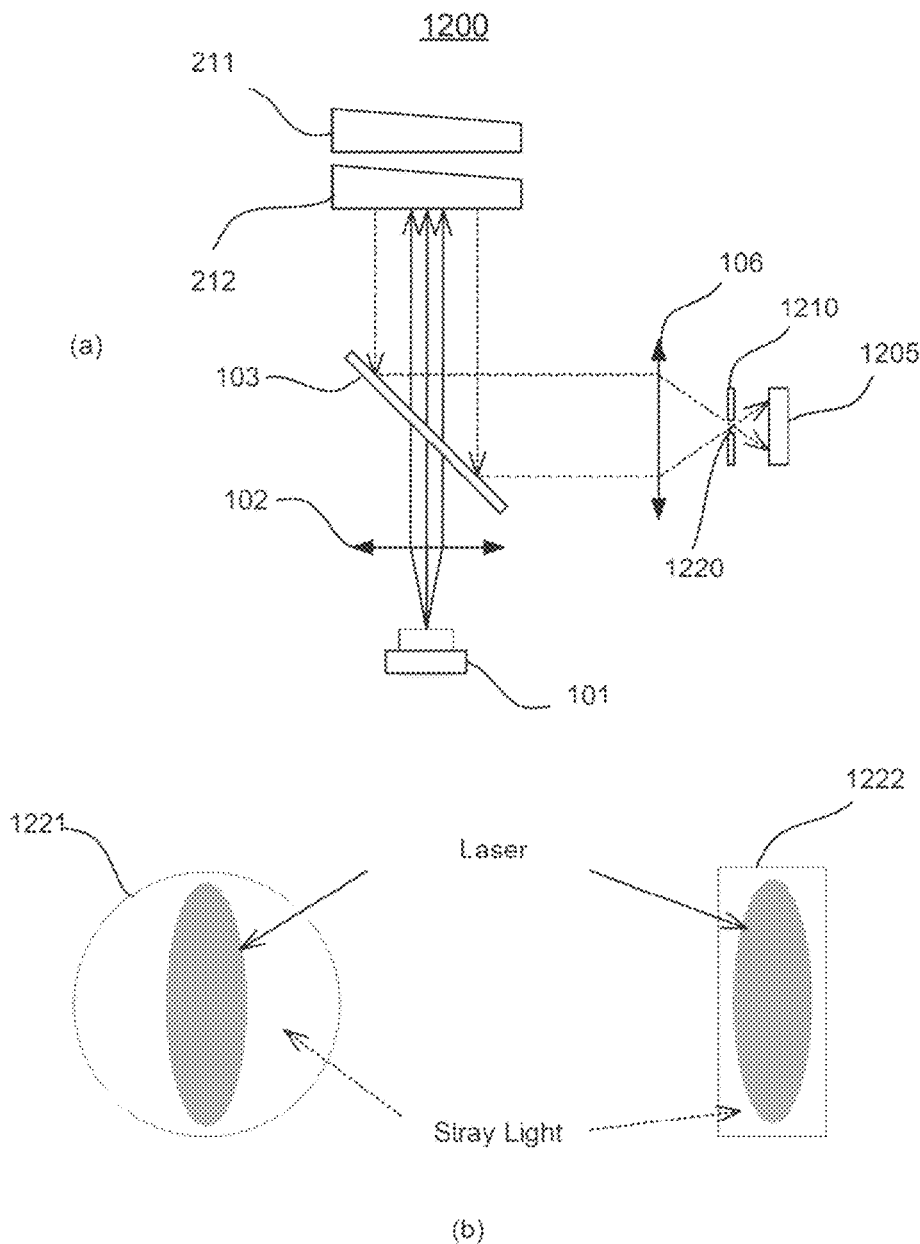
FIG. 12 shows a schematic diagram of spatial filtering in an exemplary LIDAR system, in accordance with various embodiments of the present invention.

FIG. 12 shows a schematic diagram of spatial filtering in an exemplary LIDAR system, in accordance with various embodiments of the present invention. As shown in FIG. 12(*a*), the spatial filtering device 1210 can be arranged between the receiving lens 106 and the detector 105. The spatial filtering device 1210 can comprise a screen 1210 with an opening 1220. In order to reject stray light, the opening 1220 may be arranged at the focal point of the receiving lens 106. Thus, only the return beam, which is reflected back from an object in the angle of view of the LIDAR sensor system that travels at the "right" direction toward the receiving lens 106, can pass through this opening, while the scattered light in other random direction can be blocked. Similarly, scattered sunlight may also be blocked.

As shown in FIG. 12(*b*), the opening on the spatial filtering device 1210 can be either a small pinhole 1221 (e.g. in round shape) or a slit 1222 (e.g. in rectangular shape). For example, the shape of the opening 1220 on the spatial filtering device 1210 can be configured to match the laser beam profile. In accordance with various embodiments, due to the internal structure of most semiconductor laser emitter (or diode), the laser beam profile can be in a rectangular or elliptical shape. In the case of the pinhole, the round shape 1221 does not match the laser beam profile well. Thus, more stray light may pass through the opening and reaches the receiving device. On the other hand, when a rectangular shape slit is used, the amount of stray light passing through the opening may be substantially reduced. Thus, in the example as shown in FIG. 12(*b*), it is preferable to configure the opening 1220 as a rectangular slit 1222, or other suitable shape that matches the laser beam profile.

Figure 13:
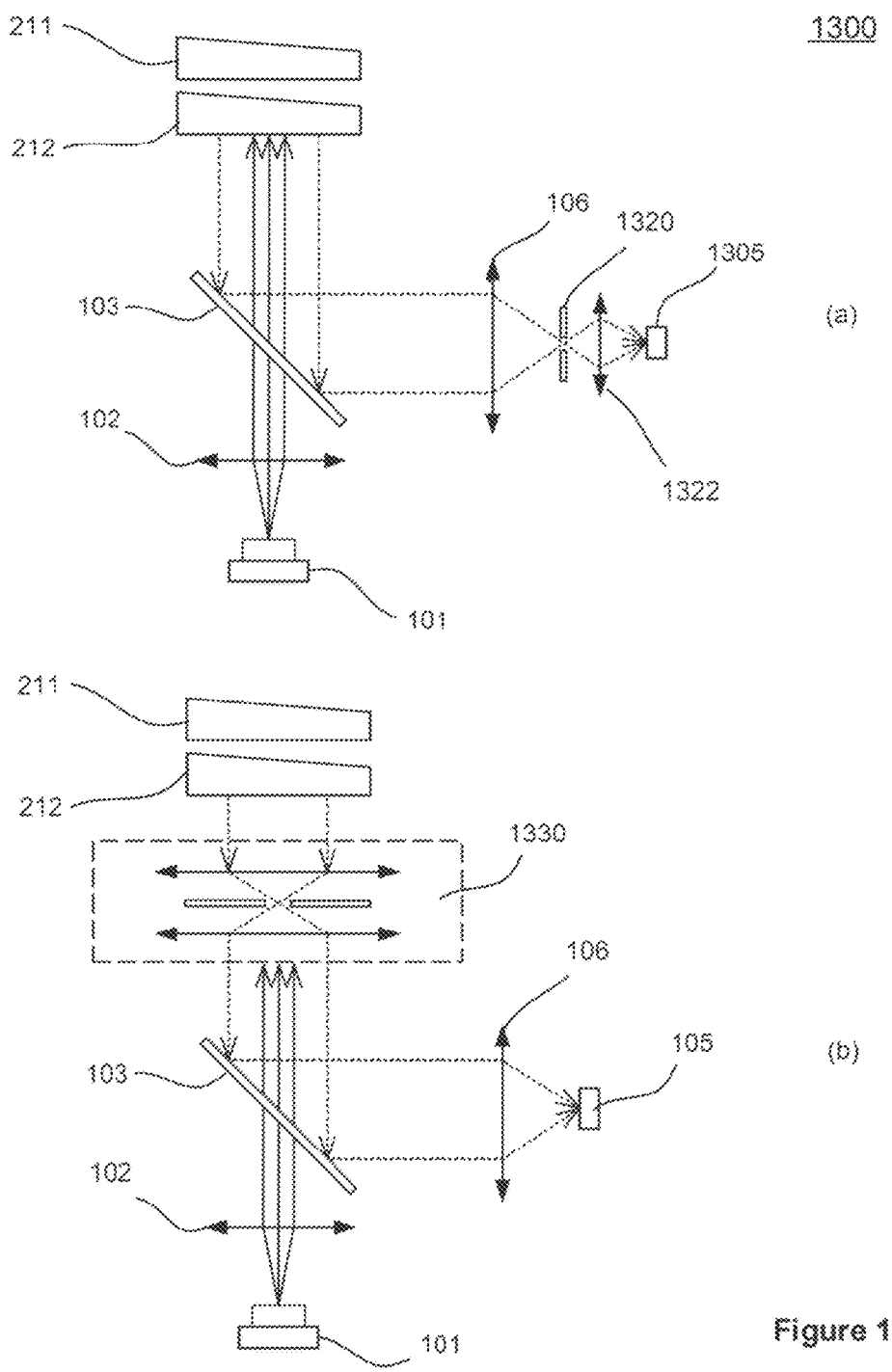
FIG. 13 shows schematic diagrams of using alternative approaches for providing spatial filtering in an exemplary LIDAR sensor system, in accordance with various embodiments of the present invention.

FIG. 13 shows schematic diagrams of using alternative approaches for providing spatial filtering in an exemplary LIDAR sensor system, in accordance with various embodiments of the present invention.

As shown in FIG. 13(*a*), the spatial filtering device 1320 and an additional lens 1322 can be arranged between the receiving lens 106 and the detector 1305. The lens 1322 can be used for focusing the filtered light, which passes through the spatial filtering device 1320, onto the receiving device 1305 of the detector. Thus, the detector 1305 can afford to use a receiving device 1205 with a substantially smaller receiving area.

Also as shown in FIG. 13(*b*), the spatial filtering device 1330 can be arranged between the receiving lens 106 and the prisms 211 and 212. Thus, the spatial filtering mechanism can be applied to block undesirable light in both the outgoing beam and the return beam, thereby improving efficiency.

Figure 14:
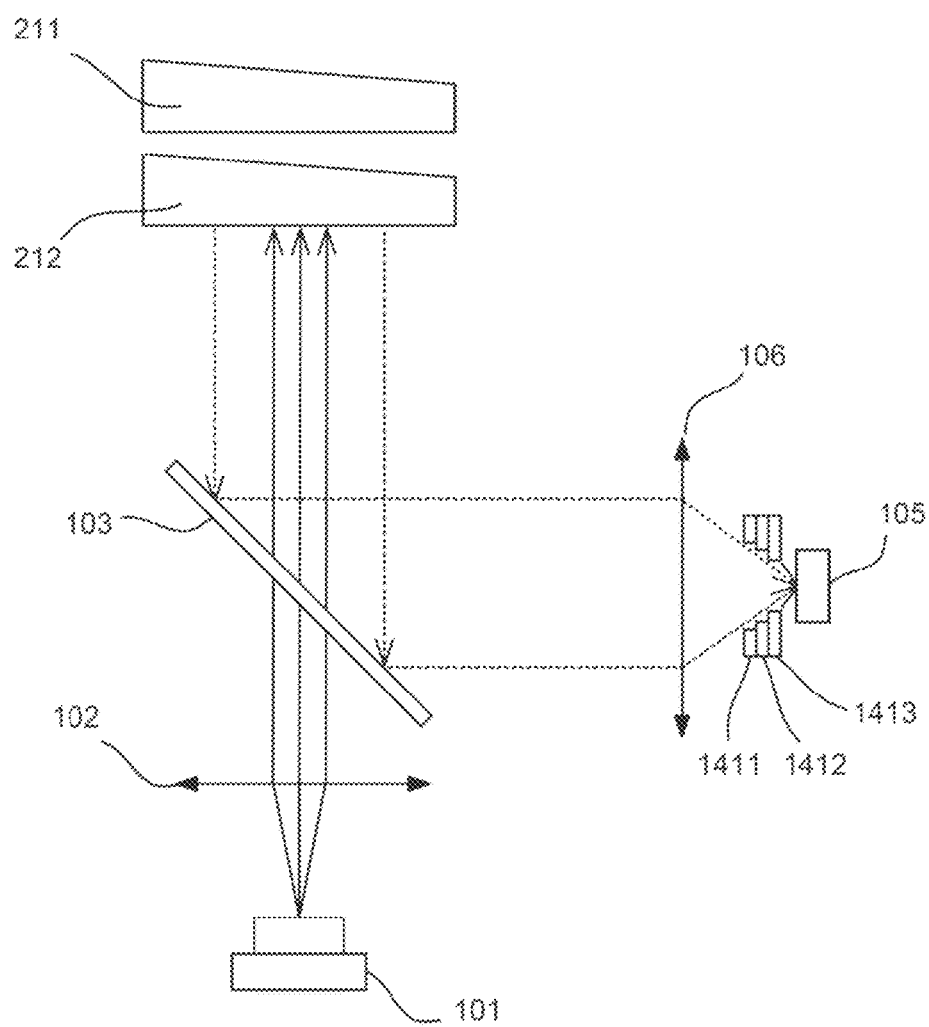
FIG. 14 shows a schematic diagram of using a field stop aperture (FSA) in an exemplary LIDAR sensor system, in accordance with various embodiments of the present invention.

FIG. 14 shows a schematic diagram of using a field stop aperture (FSA) in an exemplary LIDAR sensor system, in accordance with various embodiments of the present invention. As shown in FIG. 14, a series of field stop apertures 1411-1413 can be placed in front of the detector 105, and the stray light hitting these structures may be reflected back. Thus, the interference on the detector 105 can be reduced.

Figure 15:
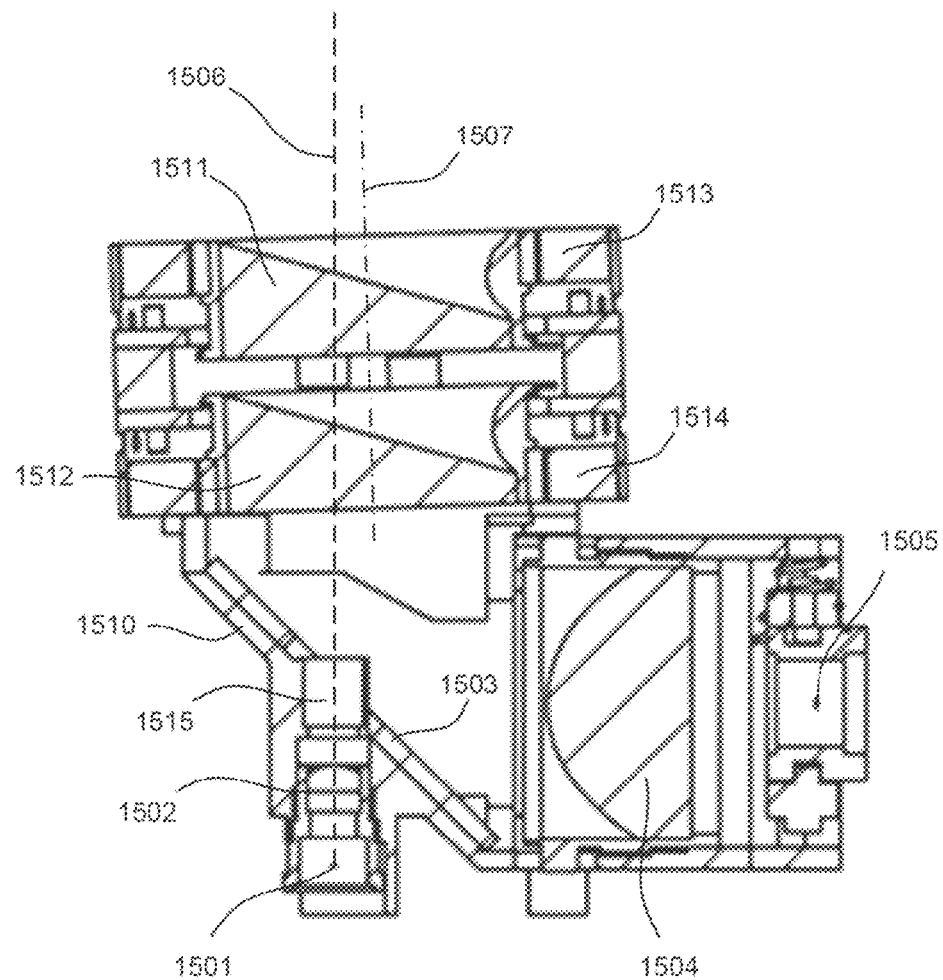
FIG. 15 shows an exemplary configuration of a LIDAR sensor system that can reduce undesired back-reflection, in accordance with various embodiments of the present invention.

FIG. 15 shows an exemplary configuration of a LIDAR sensor system that can reduce undesired back-reflection, in accordance with various embodiments of the present invention. As shown in FIG. 15, the LIDAR sensor system 1500 can take advantage of a pair of prisms 1511 and 1512, each of which can be embedded in a hollow motor 1513 or 1514 respectively. Furthermore, each prism can rotate independently about a common axis 1507, which is tilted (with an angle) relative to the optical axis 1506 to reduce direct reflection of the emitting light into the receiving devices of the detector 1505.

Furthermore, a light source 1501 can generate a laser beam that can be collimated using one or more lens 1502. Additionally, a beam splitter 1503 can be configured with a baffle tube 1515 to allow the collimated light to pass through and be directed toward the pair of prisms 1511 and 1512 for light steering. On the other hand, the beam splitter 1503 can redirect the return beam toward a receiving unit, which may include a detector 1505 and one or more lens 1504 for collecting the returned light. Additionally, the various optical components can be enclosed in a housing 1515 to ensure optical isolation, which can be beneficial for reducing optical contamination (or interference) for the detector 1505.

Figure 16:
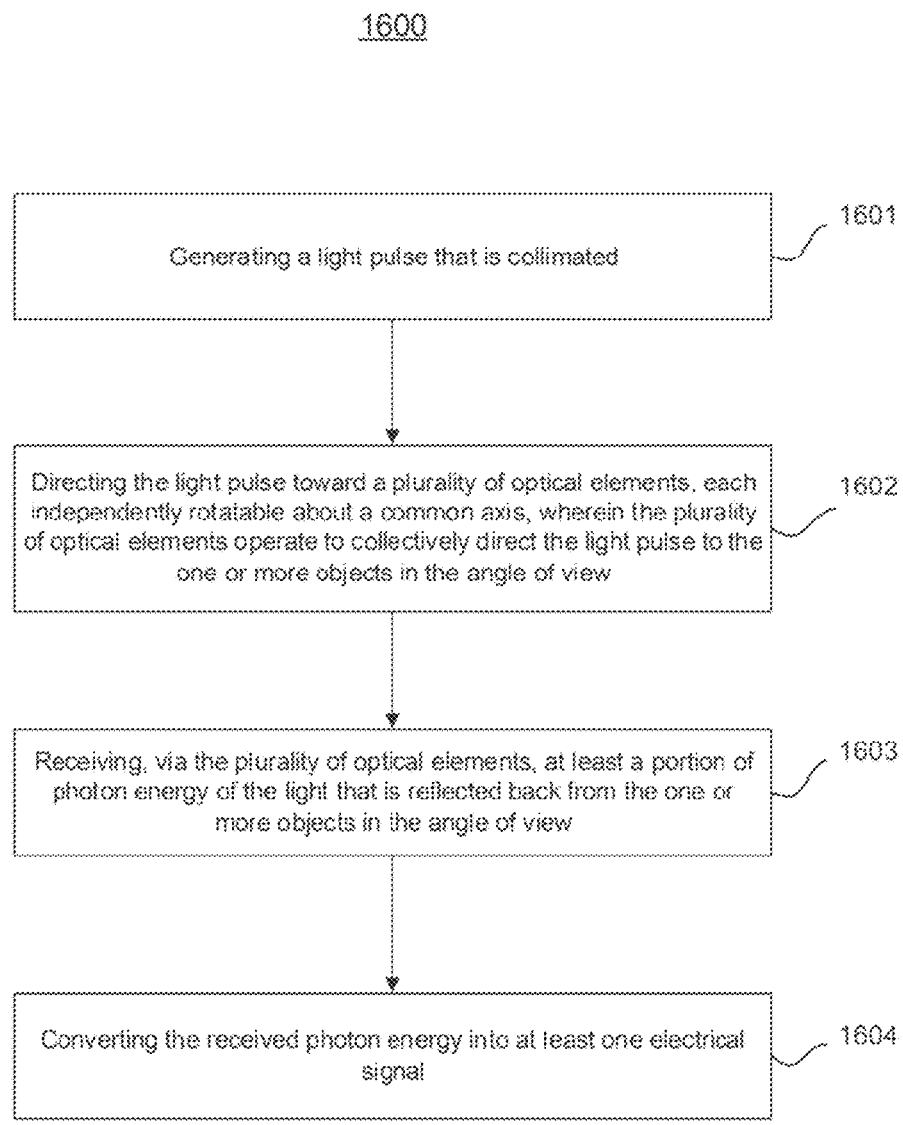
FIG. 16 shows a flowchart of sensing using a LIDAR sensor system, in accordance with various embodiments of the present invention.

FIG. 16 shows a flowchart of sensing using a LIDAR sensor system, in accordance with various embodiments of the present invention. As shown in FIG. 16, at step 1601, the LIDAR sensor system can generate a light that is collimated. At step 1602, the LIDAR sensor system can direct the light toward a plurality of optical elements, each rotatable about a common axis independently, wherein the plurality of optical elements operate to collectively direct the light pulse to one or more objects in an angle of view of the sensor system. At step 1603, the LIDAR sensor system can receive, via the plurality of optical elements, at least a portion of photon energy of the light that is reflected back from the one or more objects in the angle of view. Furthermore, at step 1604, the LIDAR sensor system can convert the received photon energy into at least one electrical signal.

Figure 17:
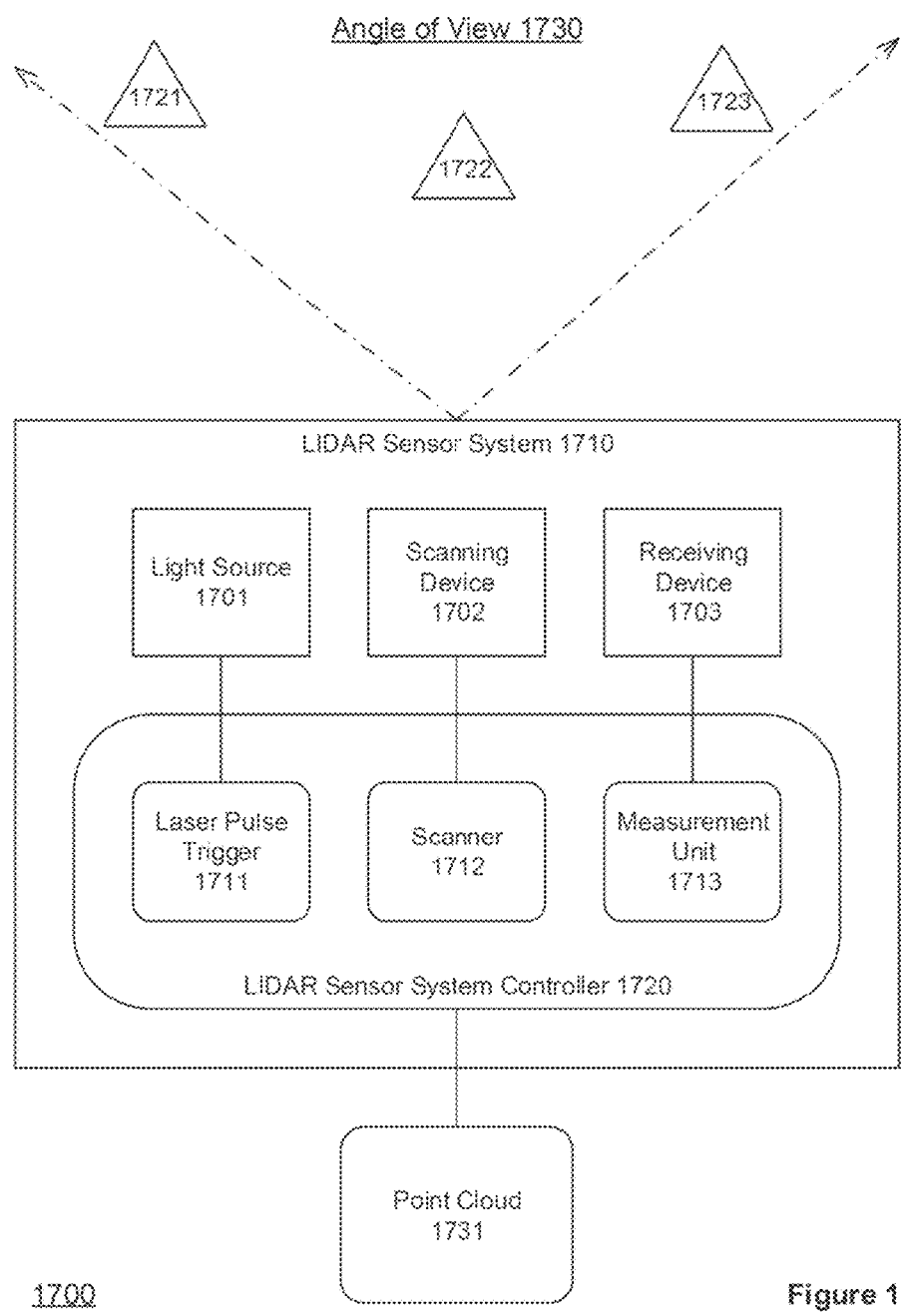
FIG. 17 shows an exemplary illustration of controlling a LIDAR sensor system, in accordance with various embodiments of the present invention.

FIG. 17 shows an exemplary illustration of controlling a LIDAR sensor system, in accordance with various embodiments of the present invention. As shown in FIG. 17 (also as indicated in various exemplary illustrations in the above), a LIDAR sensor system 1710 can comprise a light source 1701, a scanning device 1702, and a receiving device 1703. The light source 1701 can generate a laser beam, such as a single laser pulse, or a series of laser pulses, which can be collimated. The scanning device 1702 can steer the collimated light for detecting objects in the surrounding environment. Then, a portion of the light that is reflected back from one or more objects in an angle of view 1730 in the surrounding environment can be directed to the receiving device 1703 (e.g. a detector).

Furthermore, a controller, such as a LIDAR sensor system controller 1720, can be used for controlling the operation of the LIDAR sensor system 1710. For example, a laser pulse trigger 1711 can be used for controlling the generation of the laser pulses, a scanner 1712 can be used for controlling the scanning device, and a measurement unit 1713 can be used for processing the received signals and measuring the distances to one or more objects 1721-1723 in the angle of view 1730.

In accordance with various embodiments, the laser pulse trigger 1711 can be used for controlling the light source 1701 to generate a series of light pulses for scanning the environment. The laser pulses can be triggered in different manners. For example, the laser pulse can be triggered at certain time intervals. For example, the time intervals can be pre-configured or pre-determined. Alternatively, the light pulses can be triggered dynamically in-flight (e.g. by first sensing the pointing direction then determining whether to fire a pulse).

In accordance with various embodiments, a scanner 1712 can control the scanning device 1702 to steer the light pulses toward different directions in order to scan the surrounding environment of the LIDAR sensor system 1710. For example, the scanning device 1702 can be a Risley prism pair, which comprise two prisms, each with a refractive index that is different from the air. The light pulses may be refracted at different air-substrate interfaces. Thus, the final pointing direction for each light pulse can have a deviation from the original incident angle. This deviation can be used for scanning the environment surrounding the sensor system as the two prisms rotate.

In accordance with various embodiments, the LIDAR sensor system 1710 can employ a measurement unit 1713, such as a TOF unit for determining the distance to one or more objects 1721-1723 in the angle of view 1730 by measuring the time taken by the laser light to travel between the detected object and light source 1701/receiving device 1703.

In accordance with various embodiments, the LIDAR sensor system 1710 can acquire a point cloud 1731 based on scanning the surrounding environment. For example, each point in the point cloud can correspond to the transmitting of an outgoing signal (i.e. a light pulse) and the receiving of a target signal that is reflected back from an object 1721, 1722, or 1723 in the angle of view 1730.

In accordance with various embodiments, each target point in the point cloud can be acquired within a coordinate system. For example, the LIDAR sensor system can determine the angle of the outgoing signal at a time point based on instantaneous angular position of each said optical element. Furthermore, the LIDAR sensor system can determine the distance associated with the target point based on TOF between the transmitting of an outgoing signal and the receiving of a target signal. Thus, the coordinates or spatial location of each target point in the coordinate system can be determined based on instantaneous angular position of each said optical element and a distance associated with the target point.

In various embodiments, due to the potentially complex geometry, multiple target points may be detected for each object 1721, 1722, or 1723. Thus, by acquiring a large number of target points in the point cloud, the LIDAR sensor system 1710 can reveal detailed information about the surrounding environment.

In accordance with various embodiments, the LIDAR sensor system 1710 can be configured to meet various constraints. For example, in order to meet the constraint prescribed for eye safety, the LIDAR sensor system 1710 may be configured to adjust the instantaneous laser pulse energy intensity and/or the laser repetition rate, for controlling a maximum amount of energy during a certain time period. Also, the LIDAR sensor system 1710 may generate laser pulses with different width or energy level.

In accordance with various embodiments, the LIDAR sensor system 1710 can trigger laser emission based on different strategies or scanning modes. For example, the LIDAR sensor system 1710 may operate in a raw scan mode, a fine scan mode, or a fixed point scan mode.

In the raw scan mode, the LIDAR sensor system 1710 can acquire a sparse point cloud, by firing laser pulses, which are more powerful but less frequently, to detect individual target points at long range and with high precision. Thus, the system can obtain a big picture about the surrounding environment, e.g. by randomizing the scanning direction in space correspondingly.

In the fine scan mode, the LIDAR sensor system 1710 can acquire more target points that can reveal more detailed information about the scene, by firing laser pulses more frequently (i.e. at a higher laser emission rate). Here, each pulse can be configured to be less powerful to meet the eye safety constraint.

Additionally, the LIDAR sensor system 1710 can perform fixed point scan, if a particular angle or direction in the surrounding environment is of interest. For example, a specific direction in the surrounding environment may become interesting, e.g., after detecting a person crossing the street, after the raw scan and/or the fine scan. The LIDAR sensor system can rotate the prisms to steer the laser pulses toward the particular direction, and fires a series of laser pulses in (and around) that particular direction. In such cases, since the laser is steered for scanning a small area, relatively more laser pulses can be used for detecting objects in the particular direction. Laser energy can be high enough to ensure both the accuracy and range of the measurement. Since smaller area is scanned, relatively more repetitions could be used to obtain the averaged signal with better noise figures. Thus, the LIDAR sensor system 1710 can achieve a better signal to noise ratio than the general scan, even though the laser repetition rate may be limited for eye safety.

Figure 18:
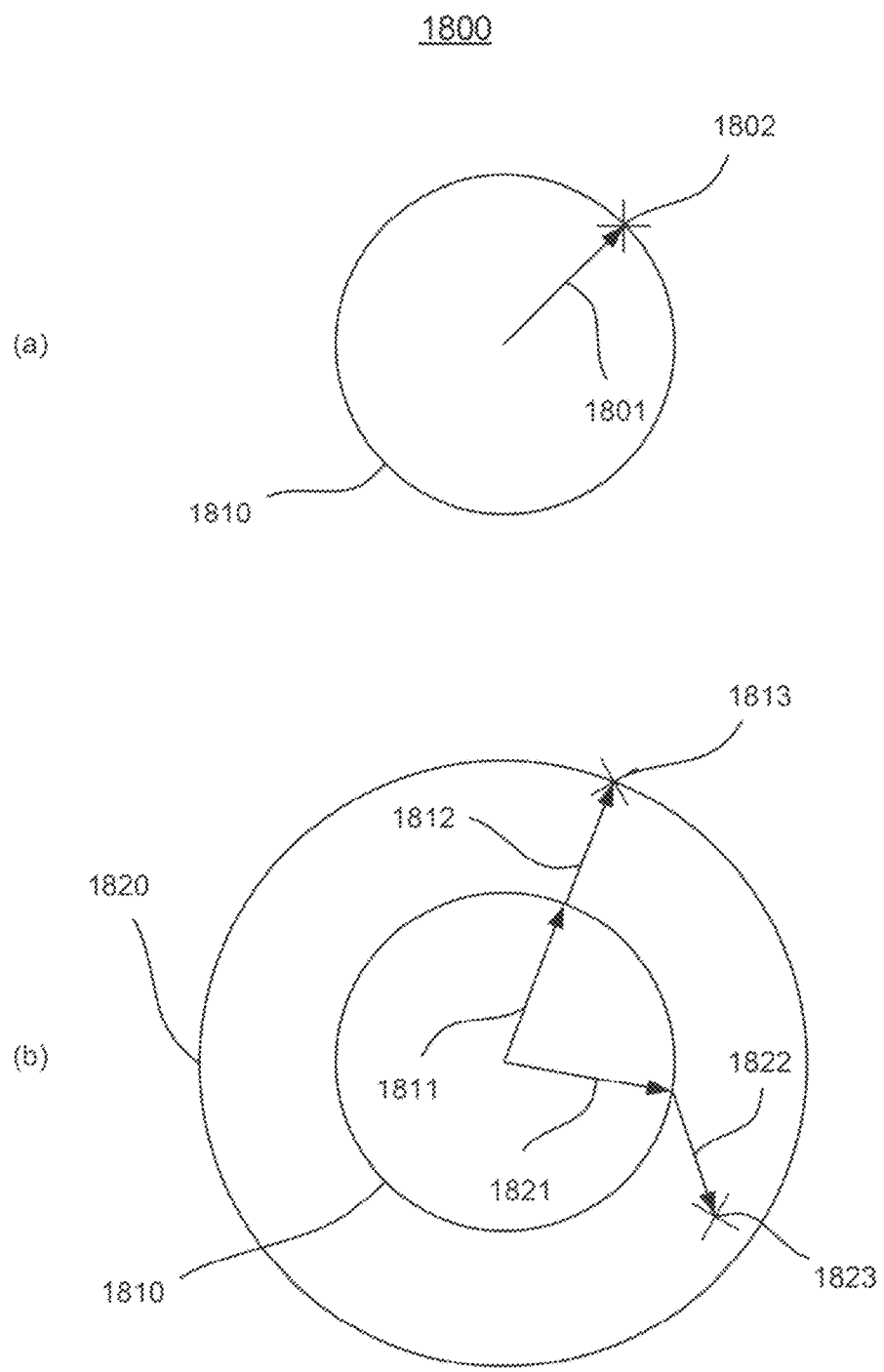
FIG. 18 shows an exemplary illustration of a deviation model for rotating a Risley prism pair, in accordance with various embodiments of the present invention.

FIG. 18 shows an exemplary illustration of a deviation model for rotating a Risley prism pair, in accordance with various embodiments of the present invention. As shown in FIG. 18(*a*), for a single prism, assuming the prism has a uniform refraction index, the refracted beam can scan a complete circle 1810 once the prism rotates 360 degrees. As the prism rotates, the instantaneous deviation of the laser beam can be represented using a point 1802 associated with a vector 1801, the direction of which represents the angle of the deviated beam in the rotating plane caused by the rotation of the prism, and the magnitude of which represents the deviated angle.

Furthermore, two prisms can be arranged in a parallel fashion (or stacked) along the optical path. Thus, the final pointing direction of the deviated beam caused by the rotation of the two prisms can be represented using a final point, which is obtained by adding the first prism vector and a second prism vector together. According to Snell's Law, the second vector may vary slightly in length with respect to the relative angle, but the vector length may be treated as a constant using the paraxial approximation (which applies to small angles).

As shown in FIG. 18(*b*), the point 1813 on the outside circle 1820, which represents the maximum deviation, can be reached when the two prisms are oriented the same way (i.e. the first prism vector 1811 and the second prism vector 1812 are aligned toward the same direction). On the other hand, the point 1823 represents a deviation that can be reached when the two prisms are not oriented the same way (i.e. the first prism vector 1821 and the second prism vector 1822 are in the different directions). Thus, in the cases when the two prisms are identical, the LIDAR sensor system can reach any point within the outer circle 1820 using certain vector configuration (i.e. orienting the two prisms appropriately).

In accordance with various embodiments of the present invention, the steered beam can travel about the rotation axis as the pair of prisms rotate. In the example as shown in FIG. 2, a controller 208 can be used for controlling the rotation of each individual prism. Each of the prisms rotates independently to collectively steer the beam to a direction that can be determined by the instantaneous position of the prism and the incident angle of the (incoming) beam. Thus, the steered beam can used for scanning the surrounding environment within an angle of view. Depending on the respective rotation of each individual prism, using the paraxial approximation, the mathematical expression for the final beam angle can be represented as $$\vec{P} = \vec{A} + \vec{B}$$

where $\vec{A}$ and $\vec{B}$ are the two vectors defined respectively by the two prisms.

Accordingly, in Cartesian coordinates, the final beam angle is $$A_x = A \cos(\omega_A t + \varphi_A)$$

$$A_y = A \sin(\omega_A t + \varphi_A)$$

$$B_x = B \cos(\omega_B t + \varphi_B)$$

$$B_y = B \sin(\omega_B t + \varphi_B)$$

where, A and B are the magnitudes (which can be the same for a pair of identical prisms), $\omega$ is the rotation angular speed and $\varphi$ is the initial angle for each prism respectively.

Figure 19:
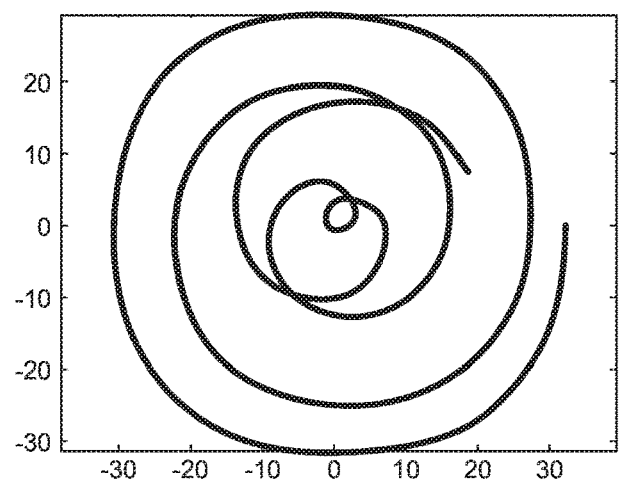
FIG. 19 shows exemplary illustration of different scanning patterns using a LIDAR sensor system, in accordance with various embodiments of the present invention.
Figure 19:
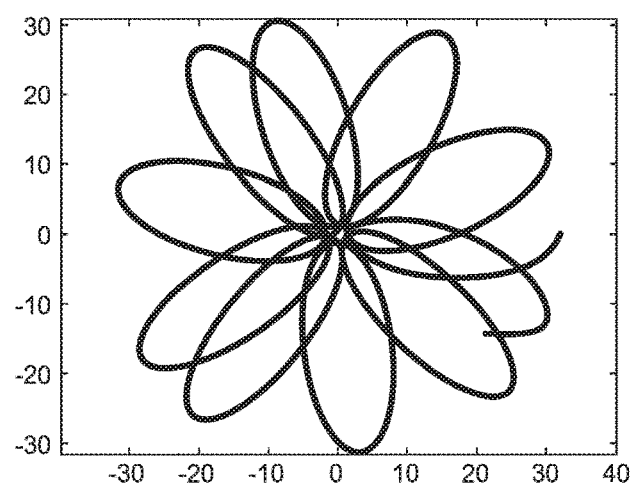

In accordance with various embodiments, depending on the respective rotation of each individual prism, such as the relative rotation speed between two prisms, the scanning may be performed in different patterns. FIG. 19 shows exemplary illustration of different scanning patterns using a LIDAR sensor system, in accordance with various embodiments of the present invention. By controlling the rotation of the two prisms, the LIDAR sensor system can achieve different scanning patterns, which may be characterized as Lissajous figures.

As shown in FIG. 19(*a*), when the difference between the two angular speeds is small (i.e. when the relative speed is small), a spiral shape scan pattern may be achieved (i.e., the light pulses are spread across the angle of view, which is favorable for scanning). On the other hand, as shown in FIG. 19(*b*), when the difference is large (or when two prisms are rotating in different direction), a flower shape scan pattern can be achieved (i.e., the light pulses are denser toward the center of the angle of view, which is favorable for ranging).

In accordance with various embodiments, the LIDAR sensor system can dynamically adjust the angular positions or speeds of the two prisms for various scanning needs. For example, the dynamic control approach can be used for achieving different point cloud patterns.

Using the example as shown in FIG. 3, when both prisms rotate at constant angular velocity, the laser pulses may be denser toward the center. In some embodiments, the LIDAR sensor system can increase the angular velocity difference between the motors when the prisms are close to the opposite directions (i.e. when that beam is close to the center), in order to uniformly distribute the laser pulses among the different scanning areas.

In accordance with various embodiments, the emitting frequency may be dynamically adjusted in order to achieve a uniform scan of the environment. For example, in the case when the deviation angle for each prism is constant and the rotation speed is constant, the emitting frequency can be configured to be proportionally to $\sin(\varphi_1 - \varphi_2)$, where $\varphi_1$ and $\varphi_2$ are the respective instantaneous angles for each prism and $\varphi_1 - \varphi_2$ is the angle difference at any given time point. For example, when $\varphi_1 - \varphi_2 = 0$, the two prisms have the same orientation. On the other hand, when $\varphi_1 - \varphi_2 = 180°$, the two prisms have the opposite orientations.

Figure 20:
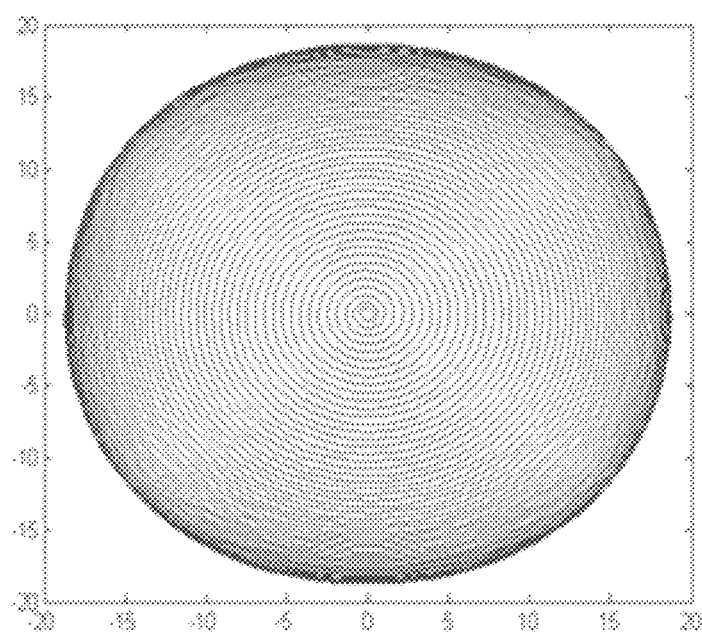
FIG. 20 shows exemplary illustration of a uniform scanning pattern using a LIDAR sensor system, in accordance with various embodiments of the present invention.

Thus, the LIDAR sensor system can achieve similar or uniform scanning speed at different directions with the angle of view in order to obtain a uniformly scanned (or distributed) point cloud. FIG. 20 shows exemplary illustration of a uniform scanning pattern using a LIDAR sensor system, in accordance with various embodiments of the present invention.

In accordance with various embodiments, the LIDAR system can dynamically adjust the angular position of each prism to steer the laser beam to a particular region of interest (ROI). Using such method, the LIDAR system can achieve directional beam scanning by accurately controlling the angular positions of the two prisms, so that the LIDAR sensor system can precisely point the laser beam to a particular direction to measure the distance for an object at the angle. Also, the LIDAR system can achieve object tracking by controlling the two prism angular positions, so that the LIDAR sensor system can track certain moving object (e.g. using a feedback control loop).

Figure 21:
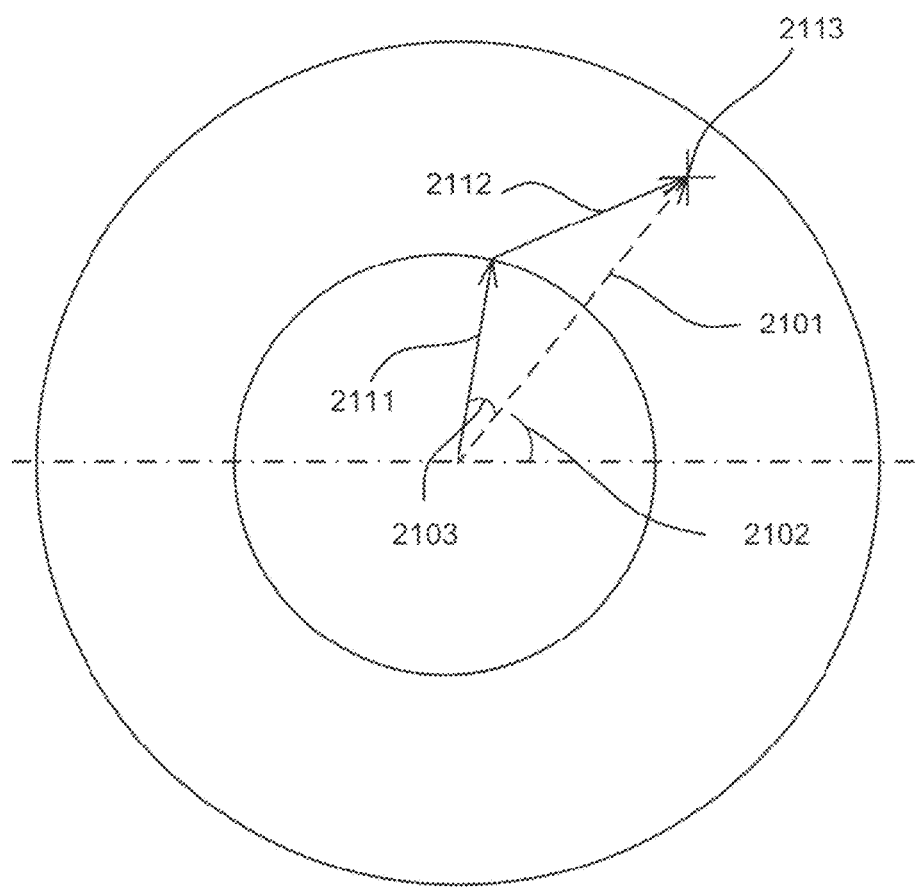
FIG. 21 shows an exemplary illustration of controlling beam steering for a LIDAR sensor system, in accordance with various embodiments of the present invention.

FIG. 21 shows an exemplary illustration of controlling beam steering for a LIDAR sensor system, in accordance with various embodiments of the present invention. As shown in FIG. 21, the point 2113 associated with a deviation vector $\vec{I}$ 2101 represents an azimuthal angle $\alpha$ 2102 that is desired. Accordingly, the LIDAR sensor system 2100 can rotate the two prisms to angular positions that can deviate the beam by $\vec{P_1}$ 2111 and $\vec{P_2}$ 2112 respectively. Thus, the angle $\beta$ 2103 can be obtained based on the magnitude of $\vec{I}$ and the magnitudes of $\vec{P_1}$ 2111 and $\vec{P_2}$ 2112, and the angles (or orientations) for the two prisms can be determined as $\alpha + \beta$ and $\alpha - \beta$ respectively.

As $\vec{I}$ changes, i.e. when the desired pointing direction is changed (in either magnitude or angle, or both), the LIDAR sensor system can be reconfigured according to the calculated $\beta$ in order to adjust for the change. Also, the LIDAR sensor system may directly vary the angle $\alpha$ to follow the azimuthal angle change. For example, assuming the prisms are identical and using paraxial approximation (i.e. $\vec{P_1}$ 2111 and $\vec{P_2}$ 2112 have the same magnitude or $P = |\vec{P_1}| = |\vec{P_2}|$), the angle $\beta$ 2103 can be calculated as $$\beta = \arccos(|\vec{I}|/2P).$$

Also, the angles for the two prisms can be swapped and the final pointing vector $\vec{I}$ 2101 would remain the same.

In accordance with various embodiments, various approaches can be used for achieving a three dimensional scan. In various embodiments, the two prisms may not be identical. For example, one prism can have a larger inclined angle than the other prism. Additionally, the prism can be replaced with a transmission grating for the same or similar effect. Also, a rotating prism can be combined with other scanning methods.

Figure 22:
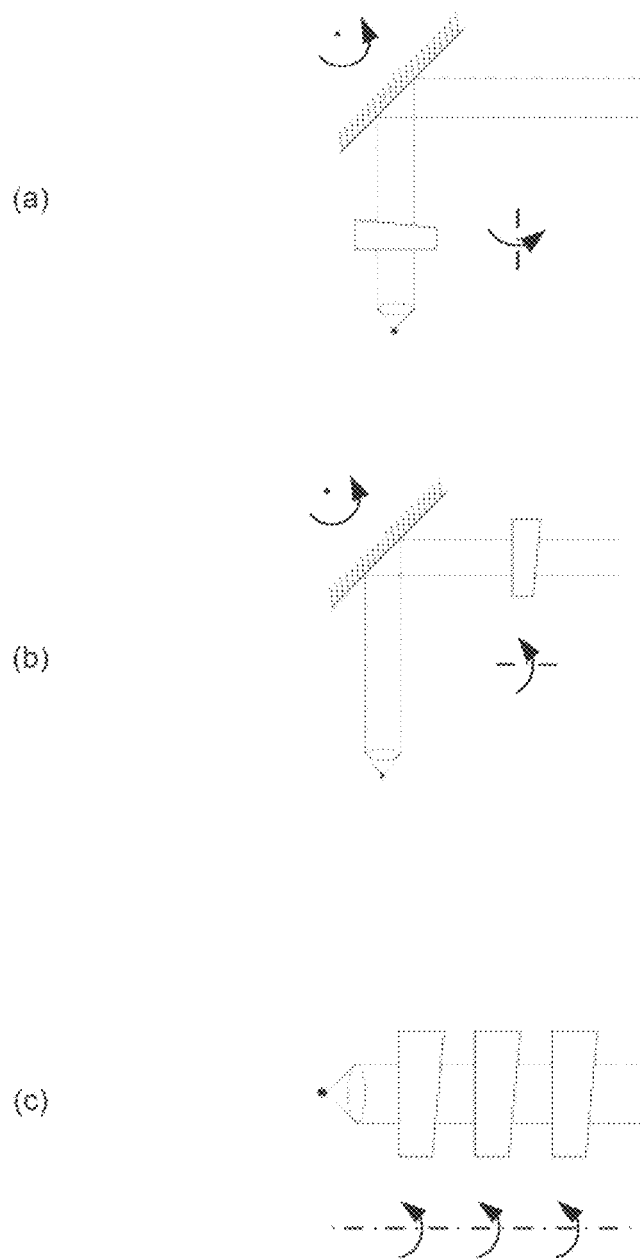
FIG. 22 shows an exemplary illustration of alternative LIDAR sensor systems, in accordance with various embodiments of the present invention.

FIG. 22 shows an exemplary illustration of alternative LIDAR sensor systems, in accordance with various embodiments of the present invention. As shown in FIG. 22(a), the light generated by a light source can first go through a prism, which can direct the light to a scanning mirror. Then, the scanning mirror can redirect the light to detect the surrounding environment. Similarly, as shown in FIG. 22(b), the light generated by a light source can first go through a scanning mirror that operates to reflect the light to a prism, which in turn can steer the light to different directions.

For the above examples, the LIDAR system can steer the light to an outgoing direction that is substantially different from the original emitting direction, due to reflection. Also, in either example, both the prism and mirror may be rotatable. Thus, the sensor system can adjust and steer the lights toward different directions in the environment.

Additionally, as shown in FIG. 22(c), the LILDAR sensor system can take advantage of multiple prisms, each of which can be individually controlled to rotate about a common axis independently. Thus, the LILDAR sensor system can have more control in scanning the surrounding environment.

In accordance with various embodiments, the LIDAR sensor system can scan a large area in the surrounding environment, even though the FOV of the LIDAR sensor system may be limited (i.e. with a narrow angle of view).

In accordance with various embodiments, the LIDAR sensor system can be used together with various types of sensors. For example, the LIDAR sensor system can be used together with an inertial measurement unit (IMU)/Gyro/GPS for mapping the surrounding environment, by taking advantage of various data fusion algorithms, such as the extended Kalman filter (EKF) algorithm. Additionally, the LIDAR sensor system can be moved around for improving the detection of the surrounding environment. Also, the LIDAR sensor system can improve the detection of the surrounding environment by acquiring more information (e.g., by accumulating information over a period of time).

Figure 23:
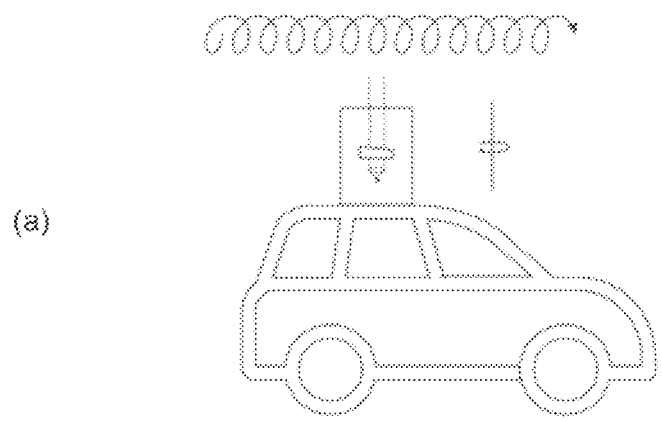
FIG. 23 shows an exemplary illustration of mounting a LIDAR sensor system on various movable platforms, in accordance with various embodiments of the present invention.
Figure 23:
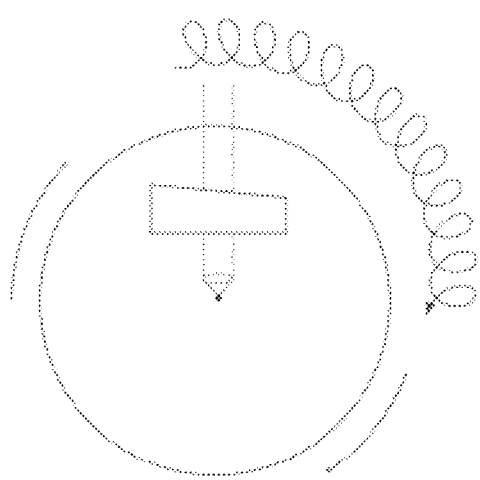

FIG. 23 shows an exemplary illustration of mounting a LIDAR sensor system on various movable platforms, in accordance with various embodiments of the present invention.

As shown in FIG. 23(a), the LIDAR sensor system with one or more rotating prisms (e.g. a Risley prism pair or other optical elements) can be mounted on a mounting platform, such as a moving vehicle that can cause a translational movement. For example, the mounting platform can be aware of both its own position and movement. Also, the mounting platform can be aware of the position and orientation (i.e. the angular position) of each prism or each optical element.

Similarly, as shown in FIG. 22(b), the LIDAR sensor system with one or more rotating prisms can be mounted on a rotating base. For example, the mounting platform can be aware of both its own position and movement. Also, the mounting platform can be aware of the position and orientation (i.e. the angular position) of each prism or optical element.

Thus, the LIDAR sensor system can scan a moving area in the surrounding environment in a translational or rotational fashion.

Figure 24:
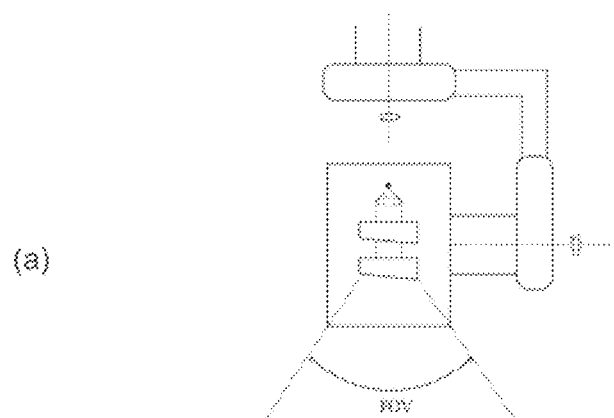
FIG. 24 shows an exemplary illustration of using a LIDAR sensor system to perform three dimensional scan, in accordance with various embodiments of the present invention.
Figure 24:
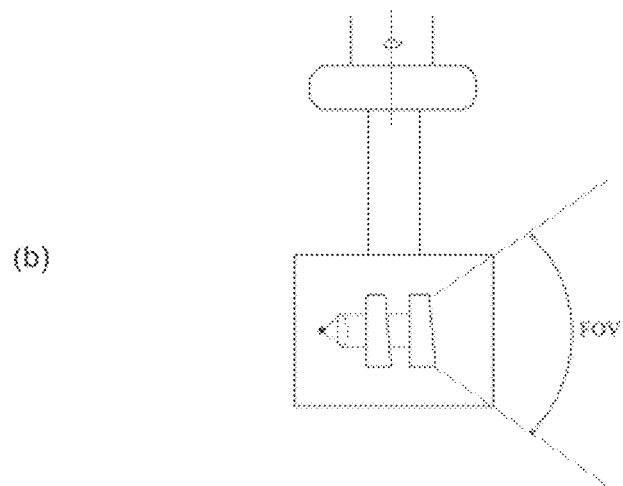

FIG. 24 shows an exemplary illustration of using a LIDAR sensor system to perform three dimensional scan, in accordance with various embodiments of the present invention. As shown in FIG. 24(a), the LIDAR sensor system can be carried by a two axis gimbal. Also as shown in FIG. 24(b), a one axis gimbal can be used to carry the LIDAR sensor system. Alternatively, other types of gimbal can be used without limitation.

Combining with the rotation movement of the optical elements (such as the Risley prisms) in the LIDAR sensor system and the rotational movement caused by the gimbal, the sensor system as shown in FIG. 24(a) or FIG. 24(b) can be used to direct the FOV (or angle of view) of the LIDAR sensor system to random directions in the three dimensional space.

Figure 25:
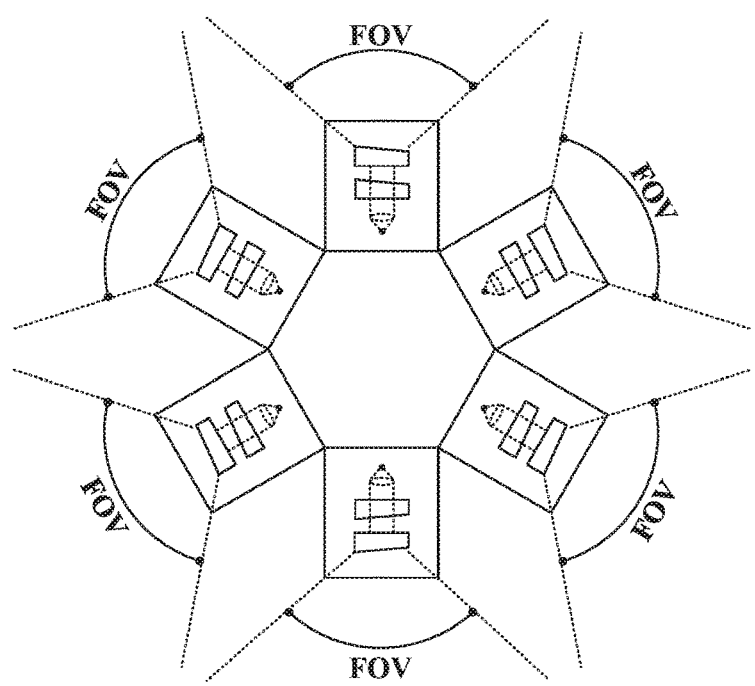
FIG. 25 shows an exemplary illustration of combining multiple LIDAR sensor systems, in accordance with various embodiments of the present invention.

In accordance with various embodiments, other approaches can be used for obtaining a large FOV (or angle of view). FIG. 25 shows an exemplary illustration of combining multiple LIDAR sensor systems, in accordance with various embodiments of the present invention. As shown in FIG. 25, multiple units of LIDAR sensor systems can be combined, with each unit facing a different direction to achieve a larger combined FOV. Also, multiple units of LIDAR sensor systems can be arranged at different positions of the base/vehicle for achieving the same or similar effects. Additionally, multiple units of LIDAR sensor systems can be arranged with overlapped FOV to provide more point density within a specific angle range.

Figure 26:
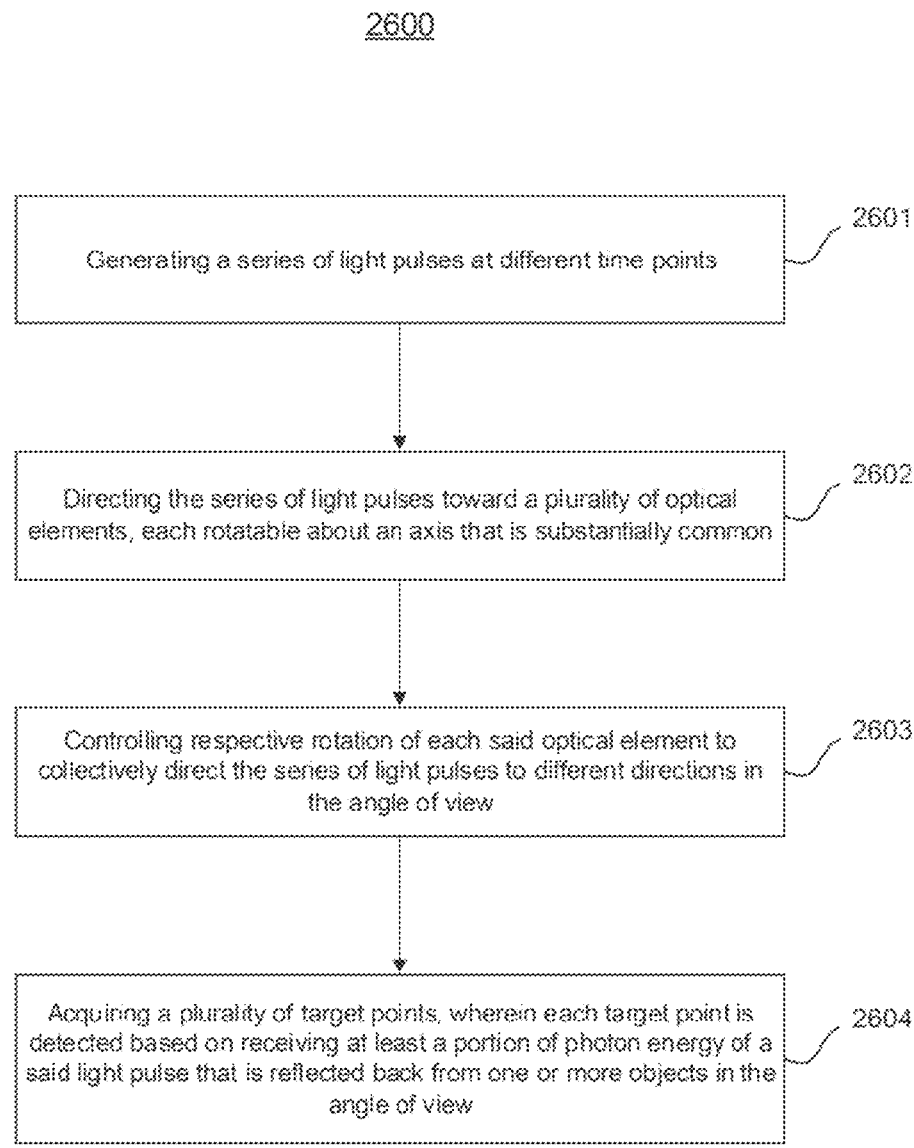
FIG. 26 shows a flowchart of scanning using a LIDAR sensor system, in accordance with various embodiments of the present invention.

FIG. 26 shows a flowchart of scanning using a LIDAR sensor system, in accordance with various embodiments of the present invention. As shown in FIG. 26, at step 2601, the LIDAR sensor system can generate a series of light pulses at different time points. At step 2602, the LIDAR sensor system can direct the series of light pulses toward a plurality of optical elements, each rotatable about an axis that is substantially common. At step 2603, the LIDAR sensor system can control respective rotation of each said optical element to collectively direct the series of light pulses to different directions in the angle of view. Furthermore, at step 2604, the LIDAR sensor system can acquire a plurality of target points, wherein each target point is detected based on receiving at least a portion of photon energy of a said light pulse that is reflected back from one or more objects in the angle of view.

Many features of the present invention can be performed in, using, or with the assistance of hardware, software, firmware, or combinations thereof. Consequently, features of the present invention may be implemented using a processing system (e.g., including one or more processors). Exemplary processors can include, without limitation, one or more general purpose microprocessors (for example, single or multi-core processors), application-specific integrated circuits, application-specific instruction-set processors, graphics processing units, physics processing units, digital signal processing units, coprocessors, network processing units, audio processing units, encryption processing units, and the like.

Features of the present invention can be implemented in, using, or with the assistance of a computer program product which is a storage medium (media) or computer readable medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems and execution environments/containers.

Features of the invention may also be implemented in hardware using, for example, hardware components such as application specific integrated circuits (ASICs) and field-programmable gate array (FPGA) devices. Implementation of the hardware state machine so as to perform the functions described herein will be apparent to persons skilled in the relevant art.

Additionally, the present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The foregoing description of the present invention has been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A sensor system, comprising:
   an emitting structure that comprises:
      a light source configured to generate a light pulse that is collimated in a first optical path, and
      a reflective surface positioned to receive the light pulse from the light source and direct the light pulse in a second, different optical path;
   a plurality of optical elements positioned in an optical aperture to allow the light pulse from the reflective surface to pass through the optical aperture via the plurality of optical elements, wherein individual optical elements are configured to rotate independently about a substantially common axis that corresponds to the second optical path, and wherein the plurality of optical elements is operable to collectively direct the light pulse to one or more objects in an angle of view of a sensor system; and
   a detector configured to
      receive, via the plurality of optical elements, at least a portion of photon energy of the light pulse that is reflected back from the one or more objects in the angle of view of the sensor system, wherein the reflective surface is positioned at a distance from a center of the optical aperture to reduce blocking the light pulse that is reflected back from the one or more objects; and
      convert the received photon energy into at least one electrical signal.

2. The sensor system of claim 1, wherein at least one of said plurality of optical elements is a prism, a grating, a mirror or an optical phased array.

3. The sensor system of claim 2, wherein the plurality of optical elements is configured to direct the light pulse to at least two different directions via rotating.

4. The sensor system of claim 3, wherein at least two optical elements of the plurality of optical elements are configured to rotate at different angular speeds.

5. The sensor system of claim 3, wherein at least two optical elements of the plurality of optical elements are configured to start rotation from different initial positions.

6. The sensor system of claim 1, further comprising:
   a beam splitter arranged between the light source and the plurality of optical elements, wherein the beam splitter is configured to direct the light pulse toward the plurality of optical elements; and
   direct the photon energy of the light pulse that is reflected back from the one or more objects toward the detector.

7. The sensor system of claim 6, further comprising:
   a baffle tube that is configured to extend a light exit on the beam splitter to prevent scattered light of the light source from interfering with the detector.

8. The sensor system of claim 6, wherein at least one optical element of the plurality of optical elements is tilted to reduce reflection of incoming light from the light source into the detector.

9. The sensor system of claim 1,
   wherein the reflective surface comprises a mirror.

10. The sensor system of claim 1, wherein the emitting structure is configured to have a narrow profile that matches a beam profile of the light pulse.

11. The sensor system of claim 1, wherein each said optical element is applied with a coating that reduces reflection.

12. The sensor system of claim 1, further comprising a band-pass filter that matches a wavelength of the light pulse.

13. The sensor system of claim 1, wherein a receiving device for the detector is configured with a profile that matches a beam profile of the light pulse.

14. The sensor system of claim 1, further comprising a spatial filtering apparatus that prevents scattered or reflected light from reaching the detector, wherein the spatial filtering apparatus comprises at least one pinhole or slit that matches a beam profile of the light pulse.

15. The sensor system of claim 13, further comprising a field stop aperture that is arranged in front of the detector.

16. The sensor system of claim 1, wherein the light pulse is emitted with an instantaneous intensity at least comparable with sunlight intensity.

17. The sensor system of claim 1, wherein the sensor system is enclosed in a housing with an emission window.

18. A method for sensing objects in an angle of view, comprising:
generating, by a light source, a light pulse that is collimated in a first optical path;
directing, by a reflective surface, the light pulse in the first optical path to a second optical path toward a plurality of optical elements positioned in an optical aperture such that the light pulse passes through the optical aperture via the plurality of optical elements, wherein individual optical elements are independently rotatable about a substantially common axis that corresponds to the second optical path, and wherein the plurality of optical elements is operable to collectively direct the light pulse to one or more objects in the angle of view;
receiving, via the plurality of optical elements, at least a portion of photon energy of the light pulse that is reflected back from the one or more objects in the angle of view, wherein the reflective surface is positioned at a distance from a center of the optical aperture to reduce blocking the light pulse that is reflected back from the one or more objects; and
converting the received photon energy into at least one electrical signal.

19. A sensor system, comprising:
an emitting structure that comprises a light source configured to generate a light pulse that is collimated in a first optical path, and
a mirror positioned to receive the light pulse from the light source and direct the light pulse in a second, different optical path;
one or more prisms positioned in an optical aperture to allow the light pulse from the mirror to pass through the optical aperture via the one or more prisms, wherein individual prisms are configured to rotate independently about a substantially common axis that corresponds to the second optical path, and wherein the one or more prisms are operable to collectively direct the light pulse to one or more objects in an angle of view of the sensor system; and
a detector configured to:
receive, via the one or more prisms, at least a portion of photon energy of the light pulse that is reflected back from the one or more objects in the angle of view of the sensor system, wherein the mirror is positioned at a distance from a center of the optical aperture to reduce blocking the light pulse that is reflected back from the one or more objects; and
convert the received photon energy into at least one electrical signal.

20. The method of claim 18, wherein the plurality of optical elements includes a first optical element and a second optical element, and wherein the method further comprises rotating the first and second optical elements at different rates.

21. The method of claim 18, wherein the plurality of optical elements includes a first prism and a second prism.

22. The method of claim 18, wherein the plurality of optical elements includes a first optical element and a second optical element, and wherein the method further comprises rotating the first and second optical elements to produce a spiral pulse distribution in the angle of view.

23. The method of claim 18, wherein the plurality of optical elements includes a first optical element and a second optical element, and wherein the method further comprises rotating the first and second optical elements to produce a spiral pulse distribution in a form of a Lissajous figure.

24. The method of claim 18, further comprising filtering a portion of photon energy.

25. The method of claim 18, further comprising forming a light beam from multiple light pulses, the light beam having a non-circular cross-section.

26. The sensor system of claim 19, further comprising a land vehicle, and wherein the land vehicle carries the emitting structure, the one or more prisms, and the detector.

27. The sensor system of claim 19, further comprising a beam splitter between the light source and the detector.

28. The sensor system of claim 19, wherein no beam splitter is positioned between the light source and the detector.

29. The sensor system of claim 19, wherein the light source, the one or more prisms, and the detector form a first unit, and wherein the sensor system further comprises at least a second unit, the second unit including a second light source and additional one or more prisms configured to rotate independently about a second common axis, and a second detector, the first and second units facing in different directions.

30. The sensor system of claim 1, further comprising a vehicle, and wherein the vehicle carries the emitting structure, the plurality of optical elements, and the detector.

* * * * *